United States Patent [19]
Jennings, III et al.

[11] Patent Number: 5,596,766
[45] Date of Patent: Jan. 21, 1997

[54] CONFIGURABLE LOGIC NETWORKS

[75] Inventors: Earle W. Jennings, III, Richardson, Tex.; George H. Landers, Mountain View, Calif.

[73] Assignee: Infinite Technology Corporation, Richardson, Tex.

[21] Appl. No.: 390,818

[22] Filed: Feb. 16, 1995

Related U.S. Application Data

[63] Continuation of Ser. No. 974,193, Nov. 10, 1992, abandoned.

[51] Int. Cl.$^6$ .................................................. G06F 9/305
[52] U.S. Cl. ........................ 395/800; 364/DIG. 1; 364/DIG. 2; 326/47
[58] Field of Search ........................ 395/800; 364/DIG. 1, 364/DIG. 2; 307/465; 326/47

[56] References Cited

U.S. PATENT DOCUMENTS

| | | | |
|---|---|---|---|
| Re. 34,363 | 8/1993 | Freeman | 307/465 |
| 4,124,899 | 11/1987 | Birkner et al. | 364/716 |
| 4,642,487 | 2/1987 | Carter | 307/465 |
| 4,742,252 | 5/1988 | Agrawal | 307/465 |
| 4,847,612 | 7/1989 | Kaplinsky | 340/825.8 |
| 4,872,137 | 10/1989 | Jennings, III | 364/900 |
| 4,935,737 | 6/1990 | Izbicki et al. | 340/825.83 |
| 4,963,768 | 10/1990 | Agrawal et al. | 307/465 |
| 4,980,836 | 12/1990 | Carter et al. | 364/483 |
| 4,982,114 | 1/1991 | Nakamura et al. | 307/465 |
| 5,046,035 | 9/1991 | Jiguor et al. | 364/716 |
| 5,079,451 | 1/1992 | Gadger et al. | 307/465.1 |
| 5,136,188 | 8/1992 | Ha et al. | 307/465 |
| 5,189,320 | 2/1993 | Gongwer | 307/465 |
| 5,204,556 | 4/1993 | Shankar | 307/465.1 |
| 5,233,241 | 8/1993 | Nishimori | 307/465 |
| 5,243,238 | 9/1993 | Kean | 307/465 |
| 5,300,830 | 4/1994 | Hawes | 307/465 |
| 5,309,046 | 5/1994 | Steele | 307/465 |
| 5,349,691 | 9/1994 | Harrison et al. | 395/800 |
| 5,371,422 | 12/1994 | Patel et al. | 326/41 |
| 5,450,608 | 9/1995 | Steele | 395/800 |
| 5,489,857 | 2/1996 | Agrawal | 326/41 |

OTHER PUBLICATIONS

Clark, "Fitting programmable Logic", IEEE Spectrum, Mar. 1992.

Ikawa, et al, "A One Day Chip: An Innovative IC Construction Approach . . . ", IEE Journal of Solid State Circuits, vol. SC–21, No. 2, pp. 223–227, Apr. 1986.

Steve Landry, "Application specific Ics, relying on RAM implement almost any logic function" Electronic Design, Oct. 31, 1985, pp. 123–130.

Carver Mead, et al Section 5.5 "The Arithmetic Logic Unit", Introduction VLSI Systems, 1980, pp. 150–154.

Roy A. Wood, "Ahigh Density Programmable Logic Array Chip", IEEE Transactions on Computers, vol. C–28 No. 9, Sep. 1979, pp. 602–608.

Primary Examiner—Tod R. Swann
Assistant Examiner—Valerie Darbe
Attorney, Agent, or Firm—N. Rhys Merrett

[57] ABSTRACT

A programmable logic device (PLD) and configurable logic network in which one or more logic combination networks (LCN) each receives logic inputs from two or more PLDs (PLD1, PLD2) and generates logic outputs (O, P) which provide inputs to programmable selectors (POR, UCL, . . . ) for controlling implementation of logic functions of various types and functionality by a controllable logic function sub-network by routing through the sub-network, logic values and logic instructions originating externally of the PLD's. Each programmable logic device includes an AND logic array (FAND . . . ) having inputs for receiving signals (Ax, Bx) and generating product term output signals and an OR logic array (OG . . . ) having inputs for receiving signals and generating sum term output signals (OF . . . ). One or both of the AND logic and OR logic arrays is programmable and the logic arrays are interconnected to apply output signals from one of them as input signals to the other one, the output from which provides PLD output signals. The logic combination networks may be fixed logic networks (LCN100) or programmable logic function generators (UBLFG2O, UBFF2P) that produce outputs controlled by a set of programmable inputs (CNx, DNx) to the generator as a function of the logic inputs (O,P) received from the programmable logic devices.

33 Claims, 20 Drawing Sheets

CONFIGURABLE LOGIC NETWORKS

RELATED PATENTS

This application includes subject matter disclosed and claimed in U.S. Pat. No. 5,394,030 filed on Nov. 10, 1992.

This application is a continuation of U.S. application No. 07/974,193 filed Nov. 10, 1992 now abandoned.

BACKGROUND OF THE INVENTION

This invention relates to configurable logic networks employing programmable logic devices (PLD).

U.S. Pat. No. 4,872,137 includes disclosure of a folded programmable logic device employing a triangular geometry, using an AND-gate array in which reprogrammable control circuits (RCC) are used to select and control programmable inputs to the AND gates. The RCC design is based on a transmission gate controlled by the user programmable content of a 1-bit shift register. The triangular geometry permits more effective use of semiconductor chip area to implement folded programmable logic devices than use of rectangular arrays employing previously proposed folding techniques. However, while this PLD design is advantageous in terms of versatility of application, operating speed and optimization of AND-gate utilization, it would be desirable to achieve a PLD structured to enable even greater versatility in terms of ability to process more complex Boolean logic inputs. Also, it is desirable to. facilitate implementation of user programmable complex logic functions.

SUMMARY OF THE INVENTION

The invention includes a configurable logic network having a plurality of Programmable Logic Devices (PLD) with PLD output signals from different ones of said plurality of PLDs applied to logic combination means to generate at least one output logic signal from said configurable logic network. Each programmable logic device comprises an AND logic array having inputs for receiving signals and generating product term output signals and an OR logic array having inputs for receiving signals and generating sum term output signals, at least one of said logic arrays being programmable. Output signals are fed from one of said AND and OR logic arrays as input signals to the other one of said AND and OR logic arrays, said other one of the AND and OR logic arrays providing PLD output signals. Thus, the PLD output may be in the form of sums of product terms, or products of sum terms. Either or both of the AND and OR logic arrays is programmable. Alternatively, the PLD output may be constructed as products of sums.

The logic combination means may produce a plurality of output logic signals from said Configurable Logic Network (LCN) which advantageously further includes means for deriving logic function signals from a selected group or groups said of output logic signals under control of signals which may be programmable.

Although in basic embodiments of the logic combination means may receive output signals from two PLDs, output signals from three or more PLDs could be utilized as inputs for the logic combination means. Sets of output signals from different groups of two or more PLDs may be used as inputs to different logic combination networks to produce multiple different output signals from the configurable logic network.

Although embodiments of the invention may be implemented using various types of PLDs, for example conventional PLAs, it is preferred to use a programmable logic device configuration comprising a plurality of groups of AND logic function gates in each group having respective outputs connected to inputs of an OR logic function gate for that AND logic function gate group. Each AND logic function gate group has one or more individual output AND logic function gates with inputs that are programmable by individually programmable logic function generators (PLFG) of a set of PLFGs operatively associated with that AND gate group. Each PLFG has a plurality of logic input sets, each PLFG in a set receiving the same logic input sets. Each PLFG has a group of logic gates (CA0 ... CA3) connected to receive first and second sets of logic signals (AB minterms; E00 ... E01), said first set of logic signals (AB minterms) comprising logic inputs for the programmable logic device. The second set of logic signals (E00 .. . E01) are programmable, preferably user programmable. The logic gates are connected to apply inputs to a PLFG output gate (CO) determined according to said first and second sets of logic signals. The PLFG output gates (CO) are connected to provide inputs to said common output gate (LC) for that set of PLFGs. Although the number of logic inputs in each first set may be identical for all of the AND logic function gate groups, it is preferred to use a folded PLD structure in which there are different numbers of logic inputs in different first sets of logic signals.

The logic combination means may suitably include a plurality of logic function generators (PLFG) in which each PLFG has a group of logic gates connected to receive first inputs comprising PLD output signals from said plurality of PLDs, and second inputs comprising respective sets of user programmable signals. The group of logic gates is connected to apply inputs to an output gate of that PLFG determined according to said first and second inputs, whereby the output gates of said plurality of PLFGs provide respective output logic signals (O,P) from the configurable logic network.

PLDs embodying the invention have utility in applications such as high speed combinatorial logic, system controllers and complex state machines. Thus, they may advantageously be employed as state machine controllers, such as communications controllers between high speed electronic systems having different clocks. For example, in a computer system, one or more conventional PLDs may typically be employed in conjunction with each of various subsystems such as video, RAM, communications, and peripheral interface subsystems, for controlling communications with the CPU. By employing PLD's embodying the invention, integration of the necessary PLDs together with the associated programmable control memory on a single semiconductor chip or wafer in a cost effective manner is facilitated. Flexibility in operation also is enhanced because the programmation of complex logic functions implemented by the PLDs can readily be changed by a user, especially when a user programmable memory is employed to store the control input values.

BRIEF DESCRIPTION OF THE DRAWINGS

By way of example, embodiments of the invention will be described in greater detail with reference to the drawings, in which.

DESCRIPTION OF THE PREFERRED EMBODIMENTS

Figure 1:
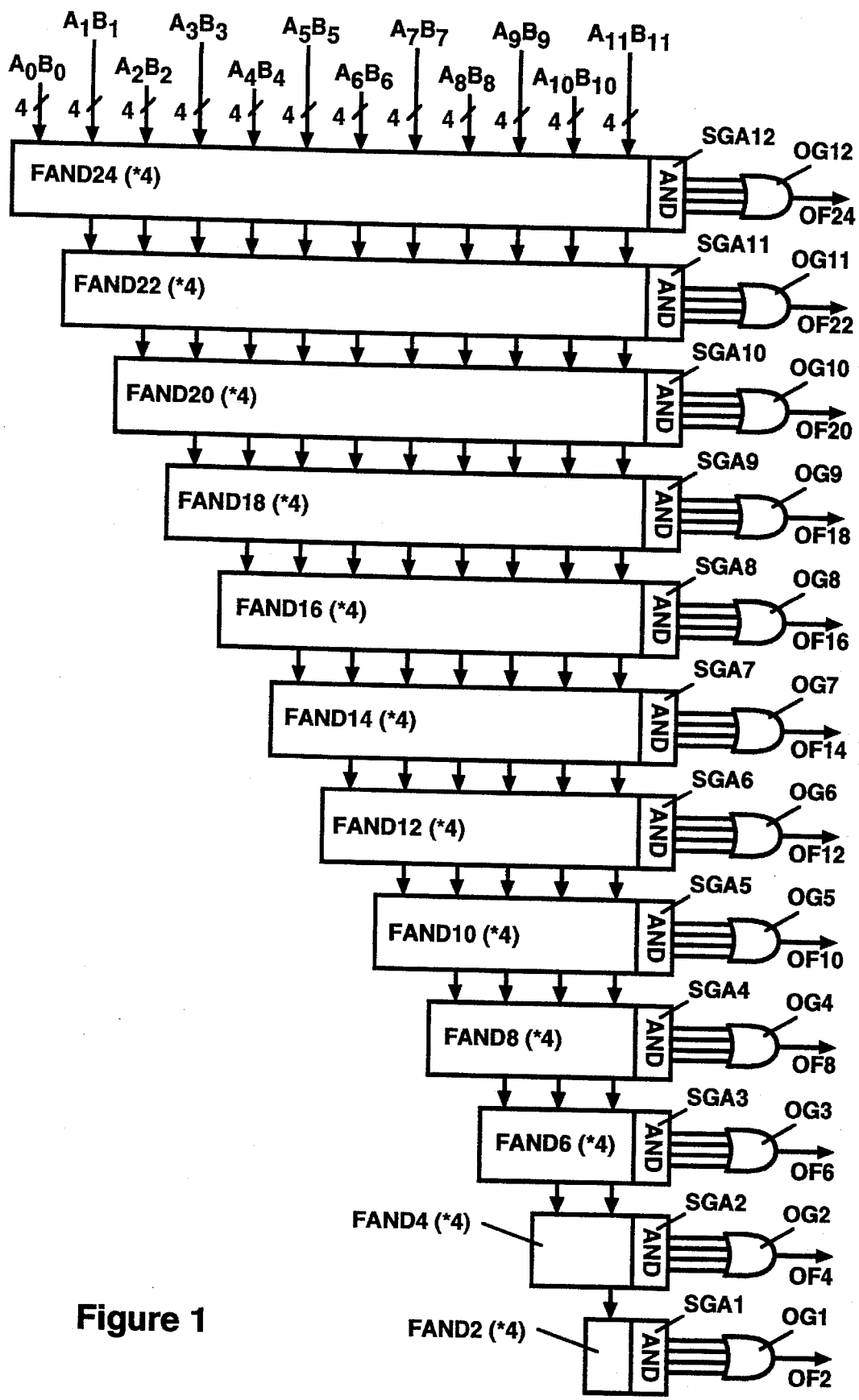
FIG. 1 illustrates the overall arrangement of an exemplary implementation of a PLD embodying the invention.

In the following description, relevant features of a basic form of PLD design particularly suitable for use in implementing embodiments the invention will be provided together with various circuit arrangements for utilizing logic outputs from one or more PLDs to enable realization of a wide variety of complex logic operations in a configurable logic network. However, embodiments of the invention may also be realized using conventional programmable devices such as, for example, PLAs in which an array of AND gates produces selected product terms of logic input signals, the product terms fed as inputs to an OR gate array which produces sums of product terms as outputs from the PLA. Alternatively, PLAs may be used in which selected sum terms of logic input signals are fed from an OR gate array which produces products of sum terms as PLA outputs. Either or both of the AND and OR gate arrays may be programmable as known in the art. In addition, the AND or the OR gate arrays may employ folding techniques as known in the art. Products of sums is another technique wherein the role of AND and OR gates are reversed.

The logic operations are diverse and may be controlled on the basis of programmable signal values stored in one or more programmable memories, which may be volatile or non-volatile memories, suitably of the ROM, PROM, EPROM, EEPROM or RAM variety. Depending on the memory type, mask programming at the factory may be employed or user programmation in the field which permits greater flexibility. While, for simplicity, the description will be made in terms of positive logic function implementations using AND and OR gates, other implementations are possible, in particular by NOR, NAND and INVERTER gates as when the PLD is fabricated using CMOS technology. Thus, references to "AND logic function" and "OR logic function" contemplate both positive logic and negative logic implementations.

Referring to FIGS. 1–15, FIGS. 1 and 2 show in outline form a preferred folded PLD device employing a group of OR gates OG12 . . . OG1 each of which receives logic product term inputs from respective subgroups of AND gates SGA12 . . . SGA1. Each subgroup comprises four AND gates AG (FIG. 2). In each subgroup, all four AND gates receive user programmable inputs derived from up to twelve logic input pairs A0B0 . . . A11B11. The programmable inputs for the AND-gate subgroups SGA12 . . . SGA1 are provided by respective sets of programmable logic function generators (PLFG) FAND24, FAND22, FAND20, . . . FAND4, FAND2, each set comprising four PLFGs providing respective inputs to the four AND gates AG in the associated subgroup SGA.

Each PLFG FAND24 provides logic function inputs to an individual AND gate AG in the AND-gate subgroup SGA12, derived from all twelve logic input pairs A0B0 . . . A11B11. The PLFG FAND22 provides logic function inputs to the AND-gate subgroup SGA11 derived from eleven logic input pairs A1B1 . . . A11B11. The PLFG FAND10 provides logic function inputs to the AND-gate subgroup SGA10 derived from ten logic input pairs A2B2 . . . A11B11. The number of logic input pairs from which the logic function inputs for the remaining AND-gate subgroups are derived decreases in this manner in an ordered sequence so that the PLFGs FAND4 and FAND2 provide logic function input pairs to the AND-gate subgroups SGA2 and SGA1 derived from two pairs A10B10 . . . A11B11 and one pair A11B11, respectively, of the logic inputs A0B0 . . . A11B11.

Thus, in sequence, the PLFGs FAND2 to FAND24 comprise AND gate function arrays having increasing numbers of inputs, or conceptionally, the inputs increase in width. In this context, for convenience of description, the PLFGs FAND will sometimes be referred to as having the same or different width, or as narrower or wider.

Figure 2:
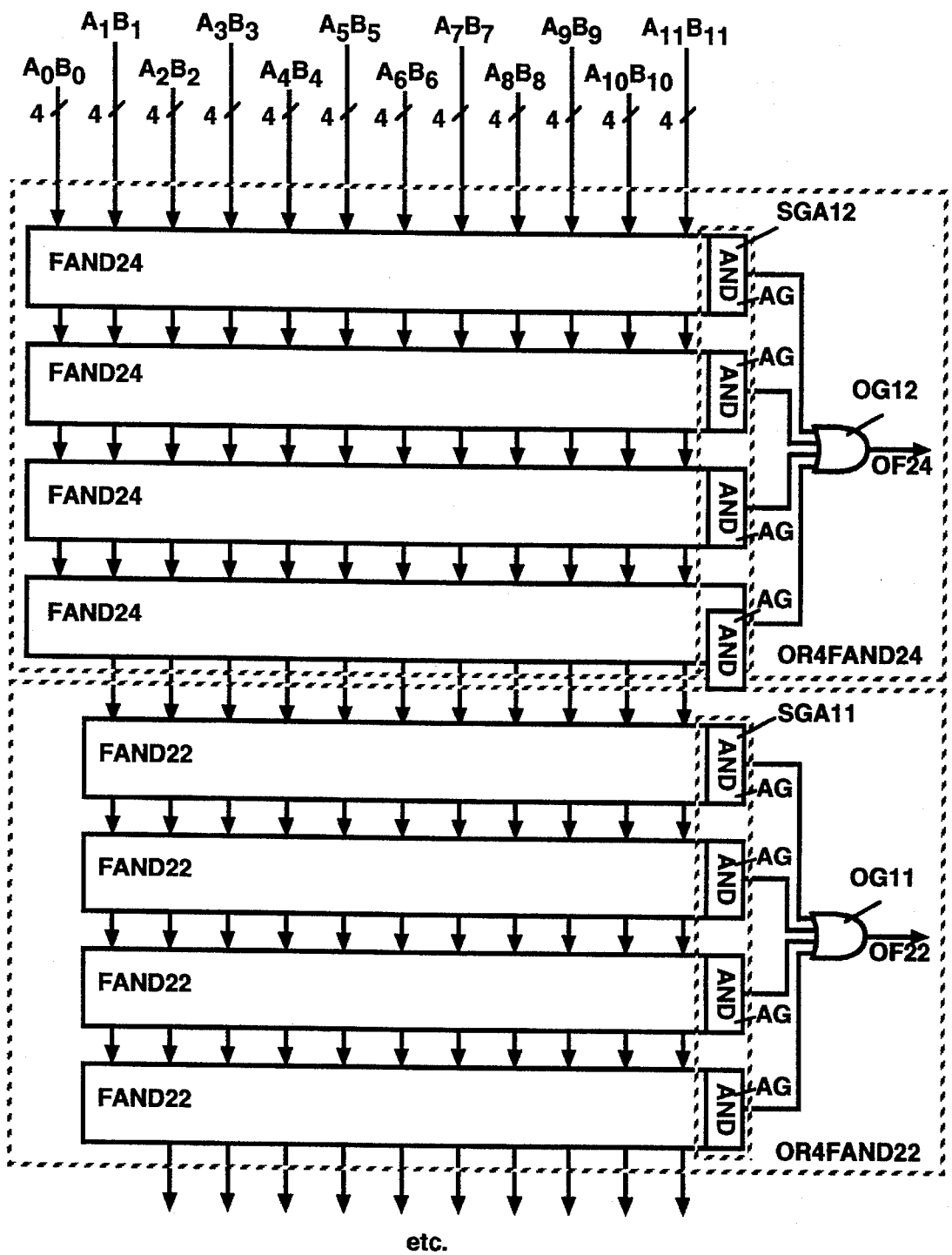
FIG. 2 shows part of FIG. 1 in more detail.

As indicated in FIG. 1, the resultant PLD array can be physically laid out on a semiconductor chip in the approximate form of a right-triangle, the OR gates OG1 . . . OG12 may be located at one of the right-angled sides alongside the AND-gate subgroups SGA1 . . . SGA12, and the area occupied by the PLFG arrays bounded by the other two sides of the triangle. Alternatively, the OR gates could be disposed at selected locations within the AND gate subgroups. As will be discussed later, such a triangular arrangement facilitates PLD layouts in a manner that results in more efficient utilization of chip area.

The use of four PLFGs in each set providing inputs for four AND gates AG in a subgroup SGA is not essential but rather a matter of design convenience. Also, each set of PLFGs need not have an identical number of PLFGs; some may have as few as one PLFGs while others may have two, three, four or more. In addition, disposition of the PLFG sets in a triangular array, although often advantageous, is not essential and folding may also be achieved by other arrangements and sequences. Furthermore, instead of individual sets of PLFGs, the sets, or at least some of them, could be arranged in groups, with the PLFGs sets in each group all receiving the same set of logic input pairs.

Figure 3:
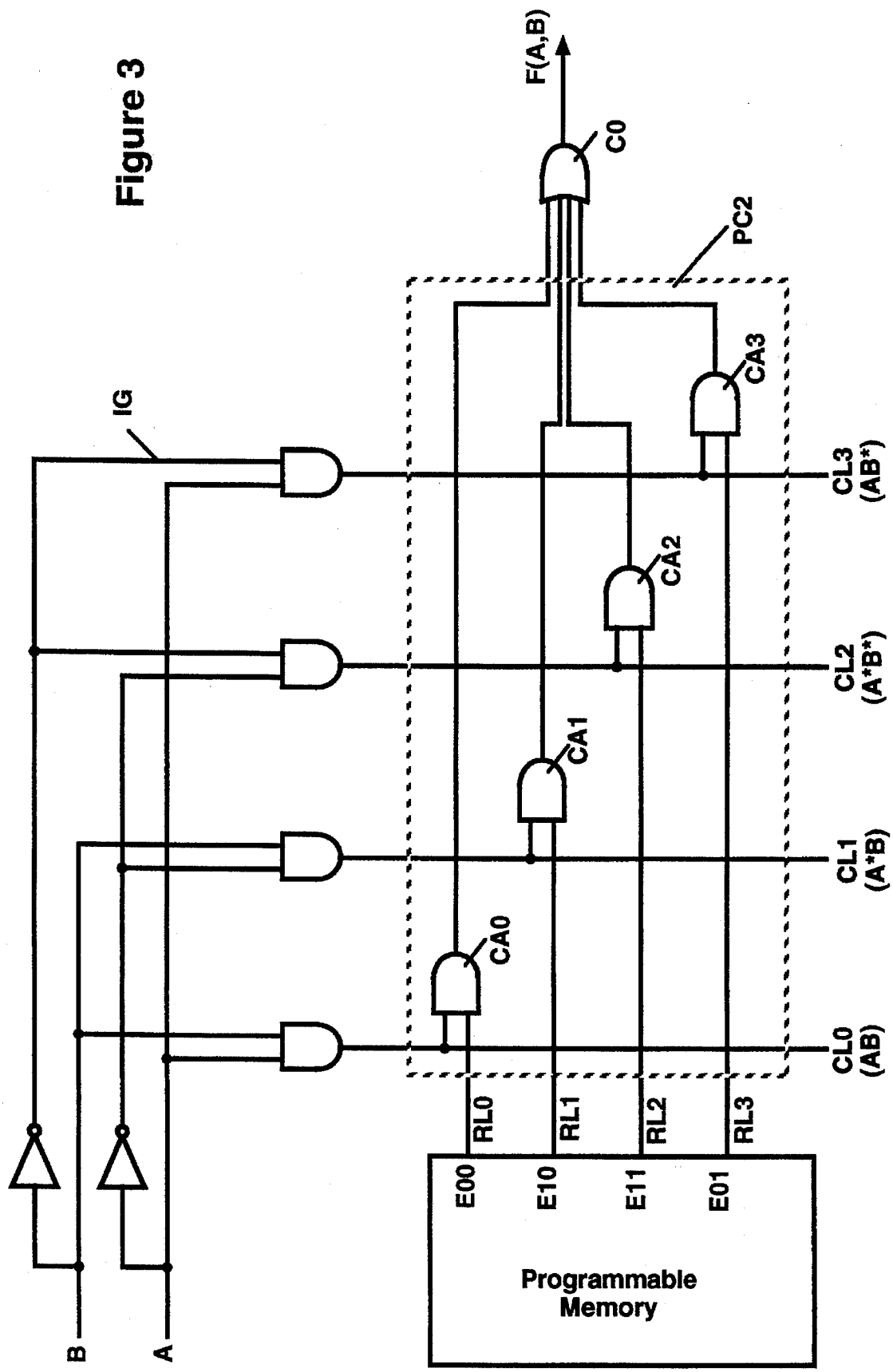
FIG. 3 shows the logic design of a programmable cell utilized in the PLD of FIG. 1.
Figure 7:
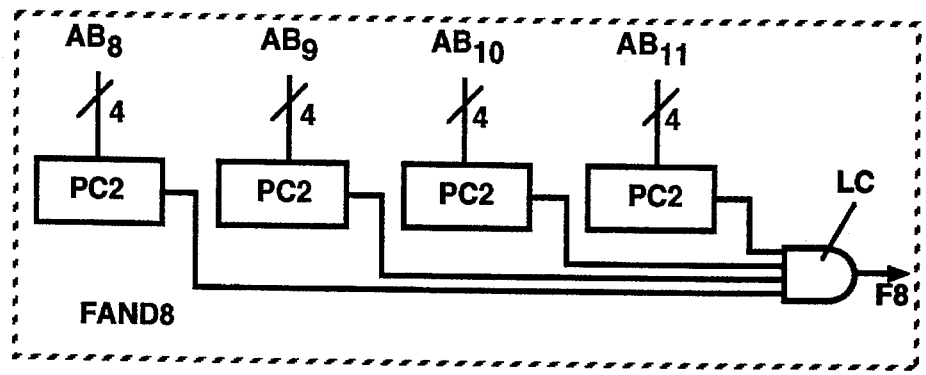
FIGS. 4–15 depict implementations of programmable logic function generators used in FIG. 1.
Figure 6:
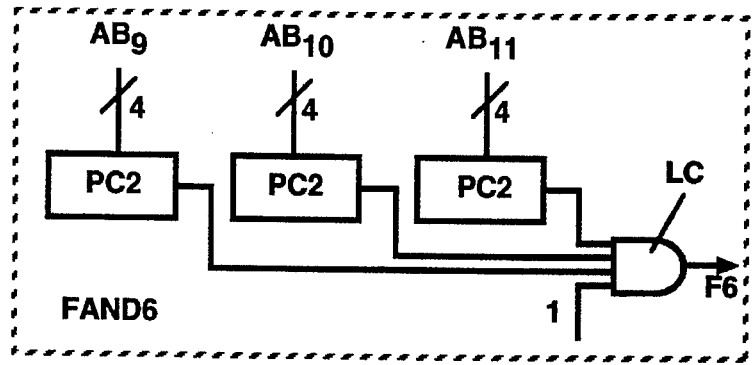
Figure 5:
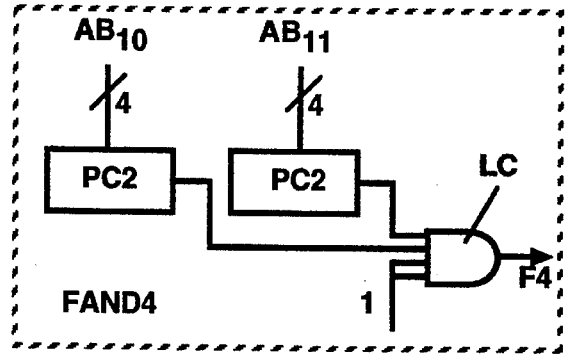
Figure 4:
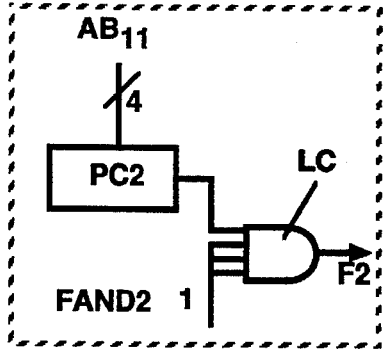
Figure 11:
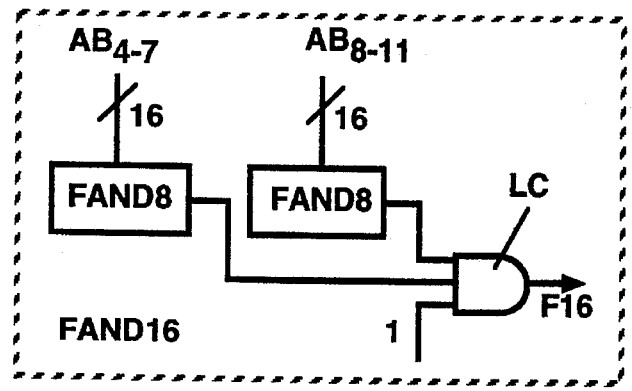
Figure 10:
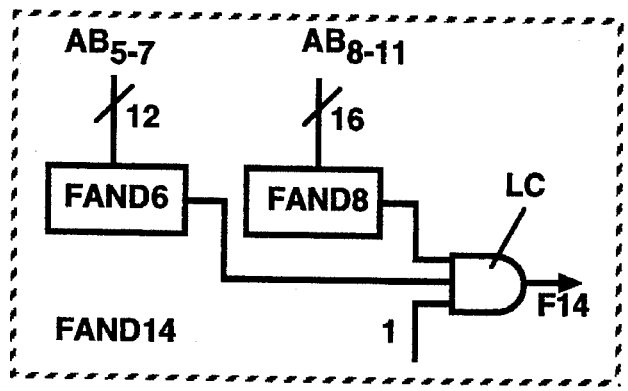
Figure 9:
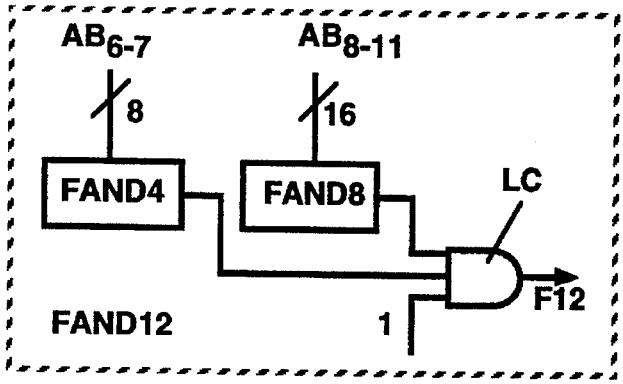
Figure 8:
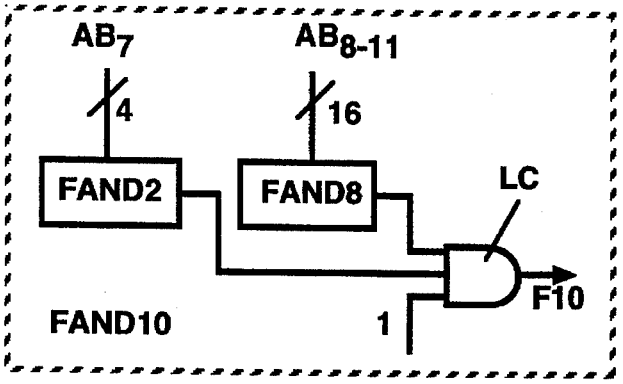
Figure 15:
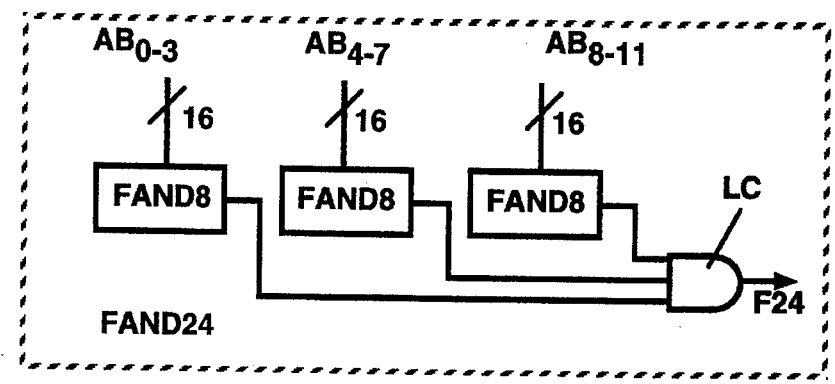
Figure 14:
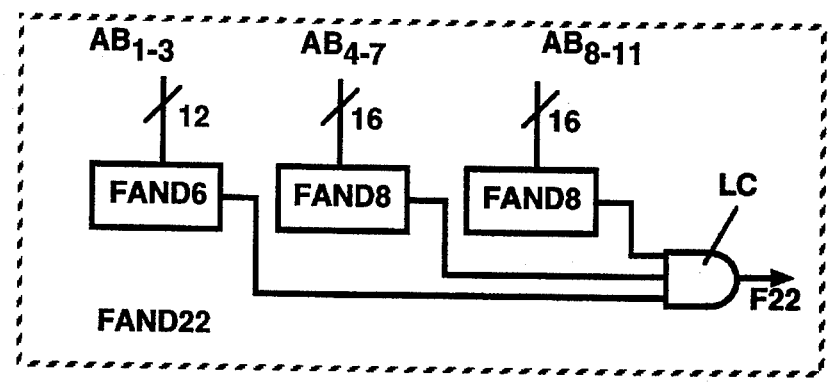

FIGS. 4–15 illustrate examples of the structure and functionality of the PLFGs FAND24 . . . FAND2 each of which comprises one or more programmable cells the design of which is shown in FIG. 3. The programmable cell PC2 includes four AND gates CA0 . . . CA3 the outputs of which are connected as inputs to an OR gate CO providing the logic function output F(A,B) from the cell. The cell also has four column lines CL0 . . . CL3 respectively connected to one input of the AND gates CA0 . . . CA3, and four row lines RL0 . . . RL3 respectively connected to the other input of the AND gates CA0 . . . CA3. An input generator IG receives logic signal input pairs A and B as inputs from which it generates the minterm logic signals A&B, A*&B, A*&B*, A&B*. These logic signals are applied to the column lines CL0 . . . CL3 respectively, while input signals E00, E10, E11, E01 are applied to the respective row lines RL0 . . . RL3, advantageously by connecting the row lines to outputs from a user programmable volatile or non-volatile memory MEM storing the signals E00, . . . E10. Thus, the generated signal F(A,B) from the OR gate CO of the programmable cell derived from the signals E00, . . . E01 determines the response F(A,B) to the logic input combination A,B. This implements the sixteen logic functions of the two logic input variables A,B. For convenience of comprehension, this programmable cell will subsequently be identified by the reference PC2 denoting that its output is determined by a fully decoded pair of logic inputs. The combined programmable cell PC2 and input generator IG will be referred to as a Universal Boolean Function Generator or "UBFG." Conveniently, the memory MEM has sufficient storage capacity to store signals providing the inputs E00 . . . E11 for the programmable cells in all the PLFGs of the PLD. MEM may comprise more than one collection of signals E00. . . E11, which may be selected by shared controls externally generated.

FIGS. 4–15 depict PLFGs FAND2 . . . FAND24 which employ various combinations of programmable cells PC2 for generating logic function outputs F2 . . . F24, respectively derived by increasing numbers of logic input pairs from the sequence A0B0 . . . A11B11 (for convenience indicated as AB0 . . . AB11) applied to the PLFGs. Thus, while the PLFG FAND2 depicted in FIG. 4 generates an output based on a single logic input pair AB11, the PLFG FAND24 generates a logic function output based on all twelve logic input pairs AB0–11.

FIGS. 4–7 depict PLFGs FAND2 . . . FAND8 having output AND gates LC which receive inputs from one, two, three and four programmable cells PC2, respectively and generate output logic functions F2,F4,F6 and F8. Each AND gate LC each has four inputs and any of those inputs not connected to a programmable cell PC2 is held at a logic 1 level. The programmable cells PC2 of the PLFGs FAND2–FAND8 receive logic pair inputs from their associated input generators IG as indicated below:

| PLFG  | LOGIC INPUTS TO GATE LC |     |      |      |
|-------|-------------------------|-----|------|------|
| FAND2 | 1                       | 1   | 1    | AB11 |
| FAND4 | 1                       | 1   | AB10 | AB11 |
| FAND6 | 1                       | AB9 | AB10 | AB11 |
| FAND8 | AB8                     | AB9 | AB10 | AB11 |

Figure 13:
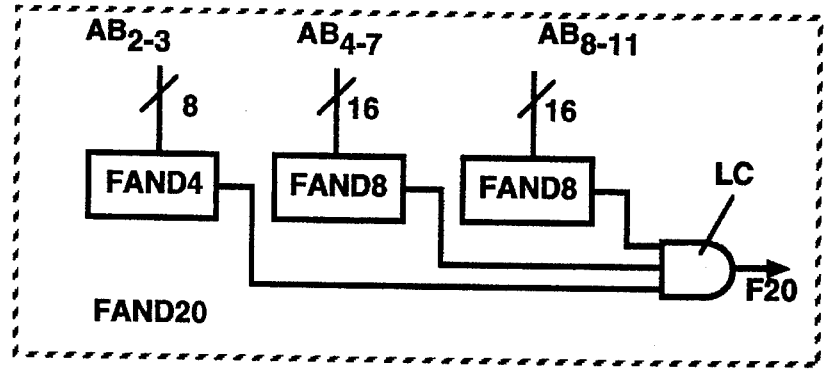
Figure 12:
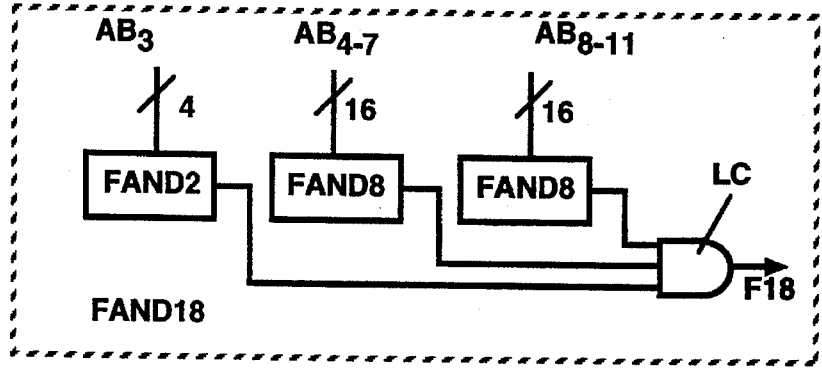

It will be appreciated that to continue to connect individual programmable cell outputs directly to individual inputs of the output gates LC of the PLFGs would significantly increase the structural complexity of the gates LC as the number of logic input pairs associated with that PLFG increases. Thus, for example, the PLFG FAND24 would require an output AND gate having twelve inputs. In order to limit the number of inputs required for the output AND gates LC of the PLFGs FAND10–FAND24, some or all of those inputs are derived from selected PLFGs structured according to FAND2–FAND8 with appropriate changes in logic input pairs. In this manner, it is possible to employ output AND gates LC having three inputs in each of the PLFGs FAND10–FAND24 as shown in FIGS. 8–15. Thus, for example, the PLFG FAND20 depicted in FIG. 13 is shown as employing two PLFGs having an FAND8 structure (FIG. 7) and receiving logic input pair sets AB8–11 and AB4–7, respectively, together with a PLFG having a FAND4 structure (FIG. 5) which receives a logic input pair set AB2–3. This is not necessary in terms of logic, but may facilitate implementation in certain semiconductor technologies including CMOS.

The programmable logic device configuration illustrated above is exemplary only. The number of rows of PLFGs, as well as the number of logic input pairs, could be fewer or greater. Further, the number of PLFGs in each rows may be fewer or greater than the four sets illustrated. The particular selection of PLFGs FAND2–FAND8 used in implementation of the PLFGs FAND10–FAND24 is not unique and other combinations than those illustrated could be used. Also, the number of inputs for the output AND gates LC is a matter of design choice and implementation. Additionally, although the AND gates AG in each of the AND gate subgroups SGA12–SGA1 are shown as four-input gates for ease of illustration, fewer or greater numbers of inputs could be used according to particular design implementations. Also, rather than two input function generation, 1, 2, 3 or more input function generators could be employed instead of PC2's.

The PLD thus far described is seen to offer considerable versatility in complexity of logic functions that may be implemented because the basic logic input pair functionalities that can be achieved by each and every one of the programmable cells PC2 can be individually and independently user programmed by the control inputs E00, E10, E11, E01 of each programmable cell. As previously mentioned, these control inputs for the programmable cells of all the PLFGs may be stored in a common user programmable volatile or non-volatile memory. Storage can be controlled by a relatively small number of signals resulting in significantly lower semiconductor chip surface area overhead. Multiple collections of E's may be stored in each PC2. The selection of which collection controls PC2 would be made by a small number of global signals.

The use of two logic input programmable cells PC2 as described above to implement the programmable logic function generators in the programmable AND logic gate array is significantly advantageous compared with implementation of AND gate arrays in conventional programmable logic devices. For example, a conventional programmable logic device may support the following logic functions of two logic inputs A, B: 0, 1, A, B, A*, B*, A&B, A*&B, A&B*, A*&B*. However, by employment OG of a programmable cell PC2 in a PLD it has been found possible to support, in addition, the following logic functions:

A&B, or A*&B(XOR); A&B or A*&B*(XNOR);

A or B; A or B*; A* or B; A* or B*.

The resultant advantage may be appreciated by considering the comparison of two 3-bit logic values using PLD embodying the invention and employing PC2 cells as described above, and a conventional PLD. In a conventional device, eight different comparisons would need to be carried out to determine equality between the compared values, wherein using PC2 cells in an embodiment of the convention, equality could be determined using three PC2 cells in one PLFG:

$$Eq=(A3 \text{ XNOR } B3)\&(A2 \text{ XNOR } B2)\&(A1 \text{ XNOR } B1)$$

The invention thus enables a PLD to be constructed using fewer AND gates in the AND gate array than in a conventional programmable logic device, for implementing a particular level of functional complexity thereby permitting faster operation.

Figure 16:
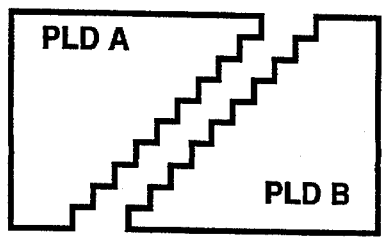
FIGS. 16 and 17 depict how triangular arrays as illustrated by FIG. 1 can be utilized to form rectangular, hexagonal and part-hexagonal arrays.
Figure 16:
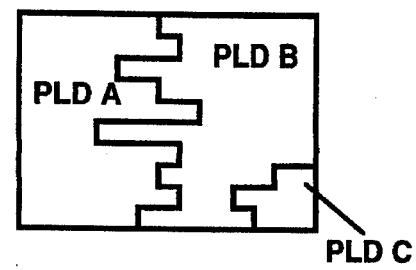
Figure 17:
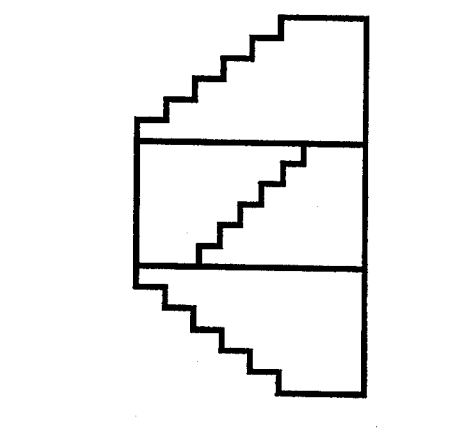
Figure 17:
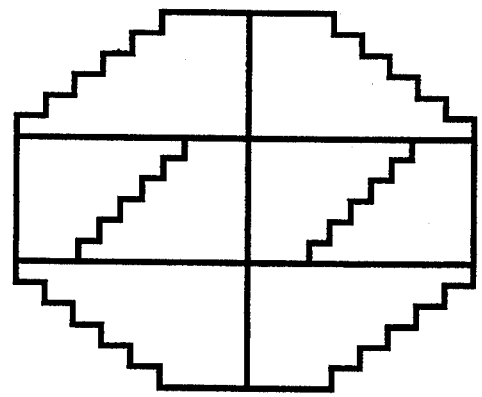
Figure 17:
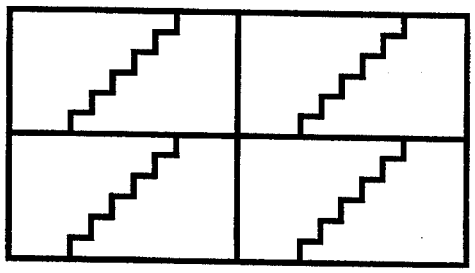
Figure 17:
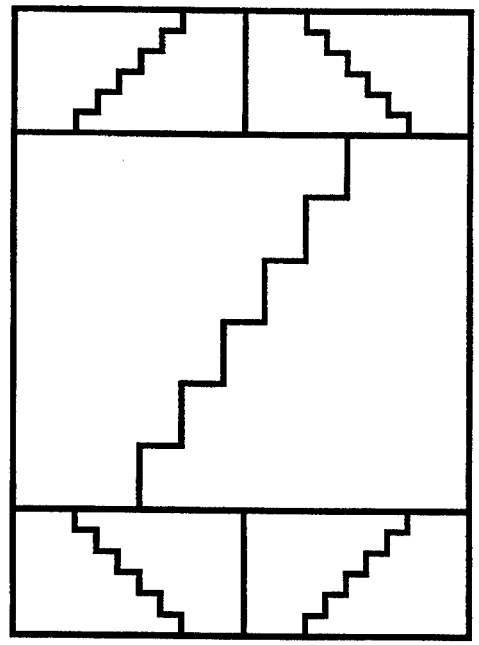
Figure 17:
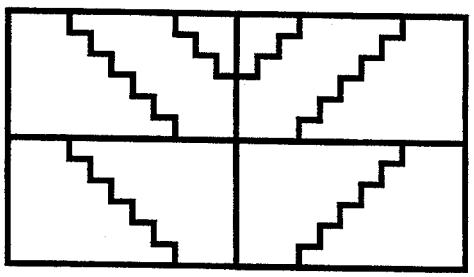

The triangular configuration of the PLD array previously referred to enables a multiplicity of array blocks to be laid out and integrated on a semiconductor chip in a manner enhancing chip area utilization and enabling a more cost effective single chip solution for applications requiring multiple conventional PLDs. For example, as shown in FIG. 16, pairs of triangular arrays PLDA and PLDB can be aligned to define rectangular blocks. Alternatively, as shown in FIG. 16, a rectangular array may be constructed using three PLDs, PLDA, PLDB and PLDC having interleaved sets of PLFGs. In addition, hexagonal and trapezoidal (half-hexagonal) blocks can be achieved by layouts of triangular arrays as indicated in FIG. 17. FIG. 17 also depicts other ways in which PLDs embodying the invention may be shaped and arranged to form overall rectangular arrays. In this manner, wafer scale integration of many folded PLD arrays embodying the invention may be achieved, with signals for the user programmable inputs E00 ... E11 of the PLFGs for all of the PLDs conveniently stored in a common, volatile or non-volatile memory integrated on the same semiconductor chip, if so desired. Thus, not only is system level chip integration facilitated but in addition, minor or major modifications in the logic functions implemented by some or all of the PLDs can readily be implemented in the field by user programming of the PFLG control inputs. Such user programmation is particularly facilitated by storage of the control input values in on-chip programmable memory.

Interconnections between pairs of PLD arrays as described with reference to FIGS. 1–15 to provide yet more complex functionality will be described with reference to FIGS. 18–23.

Figure 18:
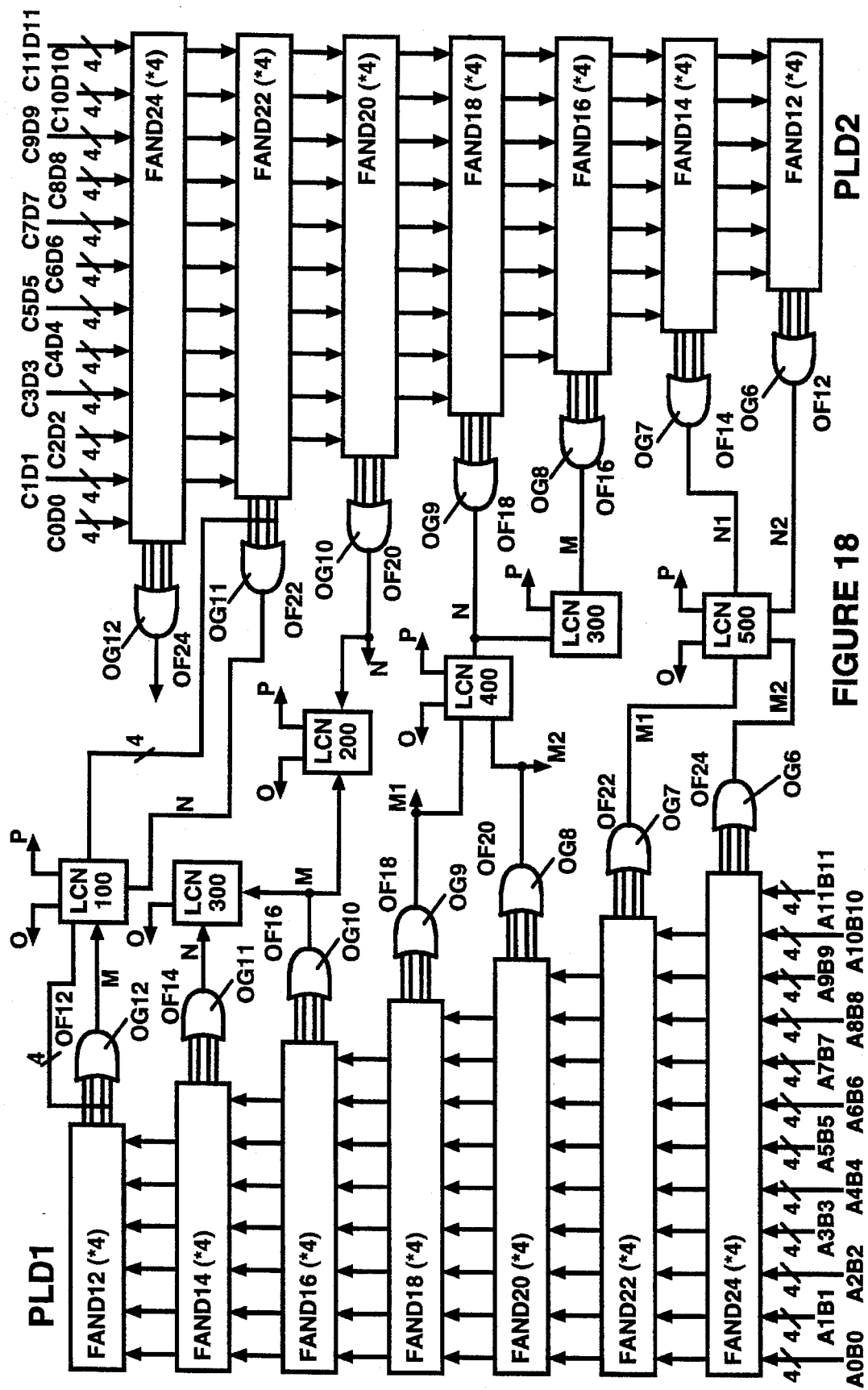
FIGS. 18–29 depict various interconnections between PLD outputs to provide more complex logic functions.

FIG. 18 depicts an interconnected logic array comprising two programmable folded logic devices PLD1 and PLD2, each having seven sets of programmable logic function generators FAND12 ... FAND24 and configured in a triangular array such as described with reference to FIGS. 1–15, but with the OR gates OG6 ... OG12 in the two devices arranged along the hypotenuse of each triangle for diagrammatic convenience. Logic input pairs A0,B0 ... A11,B11 are applied to the programmable logic device PLD1 and logic input pairs C0,D0 ... C11,D11 to the logic device PLD2. One of the two triangles is inverted with the hypotenuse of one triangle spaced from and facing that of the other triangle. Logic combination networks LCN are arranged in the intervening space so that an overall rectangular configuration is obtained. Each of the logic combination networks LCN100, LCN200, LCN400 and LCN500 receives one or more inputs from both PLD1 and PLD2 while the logic combination network LCN300 receives inputs either from PLD1 or from PLD2. The inputs to the networks LCN may be derived from the AND gate groups SGA by corrections from the outputs of selected OR gates OGx or from the inputs to the selected OR gates OGx from their associated AND gate group SGX in PLD1 and PLD2. A Logic Combination Network LCN may receive its inputs from OR gates OG or AND-gate groups SG having different width FAND groups in PLD1 and PLD2 (e.g. LCN 100 is shown as receiving inputs from the OR gates OG12 of the PLFGs FAND22 in PLD1 and PLD2) or from OR gates of same width FANDs (e.g. LCN400 is shown as receiving inputs from the AND-gates LC of PLFGs FAND18 in both PLD1 and PLD2).

The network LCN300 may receive inputs from two or more OR-gates OG of PLD1 or of PLD2 (e.g. one LCN300 is shown as receiving inputs from the OR-gates OG10 and OG11 in PLD1 and another LCN has inputs from the OR-gates OG8 and OG9 in PLD2) and these inputs may be grouped in multiples other than two. Such arrangements permit not only outputs M and N from the individual OR gates OG of the two programmable logic devices PLD1 and PLD2 to be obtained, but also one or more outputs O and/or P from each logic combination network LCN based on logic signals derived from either or both of the devices PLD1 and PLD2. The output(s) O,P from the logic combination networks LCN may be used externally or as feedback logic input(s) (e.g., as members of the logic A, B and/or C, D input sets) to one or both of PLD1 and PLD2.

FIGS. 19–23 show examples of various logic control networks LCN and their connections to the programmable logic devices PLD1 and PLD2. The input signals to CN1 ..., DN1 ... of each of the control networks LCN in FIGS. 20–23 which are user programmable may conveniently be derived from values stored in a user programmable volatile or non-volatile memory which may be the same memory used to supply the programmable control inputs to the PLFGs in the programmable logic devices PLD1 and PLD2. This permits even greater versatility and user management of complex logic functions to be obtained.

Figure 19:
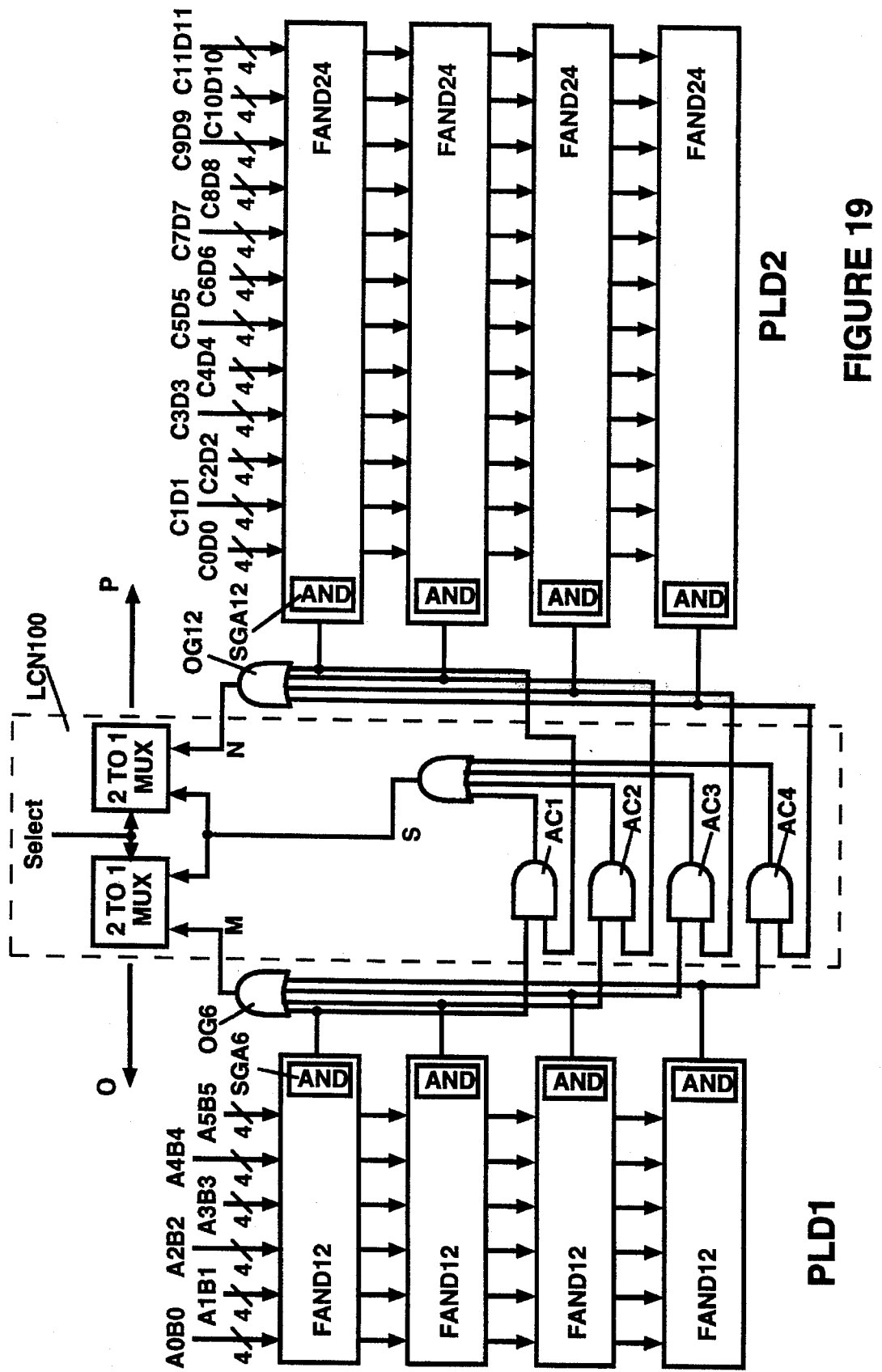

FIG. 19 shows an example of a logic control network LCN100 comprising four AND gates AC1 ... AC4 whose outputs are input to a common OR gate producing an output O(P). The AND gates AC1 ... AC4 receive first inputs from respective AND gates of a subgroup SGA6 (FAND12) in PLD1 and second inputs from respective AND gates of a subgroup SGA12 (FAND24) in PLD2. Inputs to the AND gates AC1 ... AC4 could be derived from AND gates of subgroup SG of FANDs of the same width it desired, e.g., FAND6 in both PLD1 and PLD2. The logic function outputs M,N and/or O(P) may be used externally of the interconnected logic array or feedback as logic inputs to selected PLFGs in PLD1 and PLD2. In normal circumstances, it is unlikely that both outputs M and O(P) or N and O(P) would be used, in which case a pair of multiplexers may be included as shown in FIG. 19 to select either output O(P) from both sides or output M from one side and output N from the other side.

Inputs to the AND gates of the network LCN 100 alternatively could be obtained from FAND arrays of the same width in PLD1 and PLD2. Instead of the particular configuration of AND/OR gates shown in FIG. 19, the network LCN could employ other configurations of logic gates (AND, OR, NAND, NOR, and/or INVERTER) to obtain desired fixed logic networks. Moreover, a Universal Boolean Function Generator(s), for example similar to that described with reference to FIG. 3, could be used in place of one or more of the fixed AND gates and Or gates logic network LCN shown in FIG. 19. Also, instead of obtaining inputs from the output AND gates AG of a PLFG, outputs from pairs of OR gates OG of PLD1 and PLD2 could be used.

The interconnected logic array described with reference to FIG. 19 enables very wide products (AND gate outputs in LCN) to be used in a sum (OR gate output in LCN). This minimizes the possibility of needing a logic signal requiring more inputs than can be supported by either PLD1 or PLD2.

Figure 20:
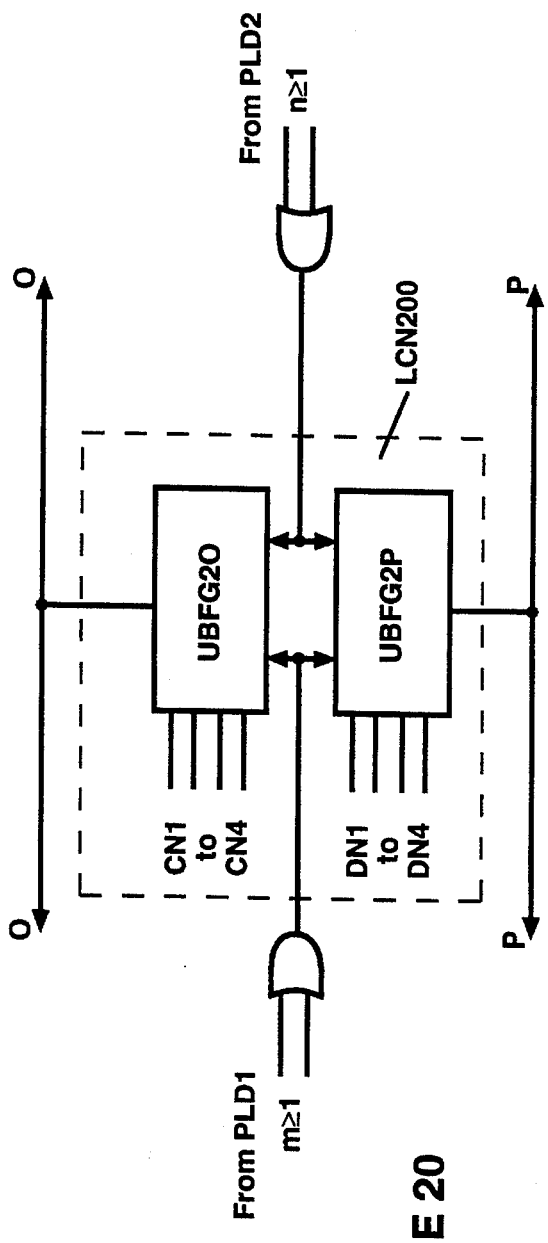

FIG. 20 shows an example of a logic combination network LCN200 wherein two programmable Universsal Boolean logic Function Generators UBFG2O and UBFG2P, as described with reference to FIG. 3, each receives logic inputs Mx,Nx from OR gates OGx of identical width FAND arrays in PLD1 and PLD2. The FAND arrays may be of the same or different widths. The generators UBF2O and UBFG2P produce respective outputs O and P independently determined by programmable sets of logic signals to the control inputs CN1–4 and DN1–4.

Figure 21:
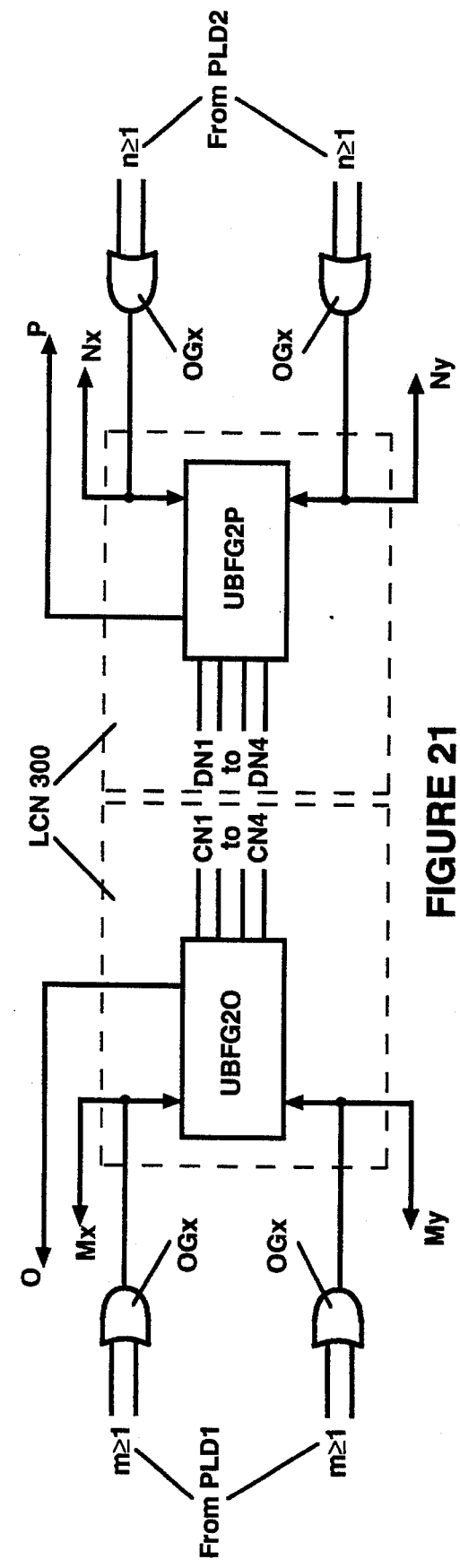

FIG. 21 shows an example of a logic control network LCN300 employing two programmable Universal Boolean Function Generators UBFG2O and UBFG2P. The function generator UBFC2O receives a pair of logic inputs Mx,My from the OR gates OGx and OGy of two different programmable logic function generators FAND of PLD1. The function generator UBFG2P receives a pair of logic inputs Nx,Ny from the OR gates OGx and OGy of two different programmable logic function generators FAND of PLD2. The logic function generators FAND need not be the same width in each of PLD1 and PLD2 nor need the function generators FAND be located in adjacent FAND arrays of a programmable logic device. Each of the generators UBFG2O and UBFG2P is independently user programmable by respective sets of logic signals to control inputs CN1–4 and DN1–4.

The connections within and between PLD1 and PLD2 provided by the network LCN as described with reference to FIGS. 20 and 21 each allows for much more complex logic signals to be generated by either or both PLD1 and PLD2. For example, considering FIG. 20:

let Mx=MP1 or MP2 or MP3 or MP4; and Nx=NP1 or ... NP4.

P can equal Mx & Nx=MP1 & NP1 or ... MP4 & NP1 or MP1 & NP2 or ... MP4 & NP2 ... or MP1 & NP4 or MP4 & NP4 where P represents the output from UBFG2P in FIG. 20.

Figure 22:
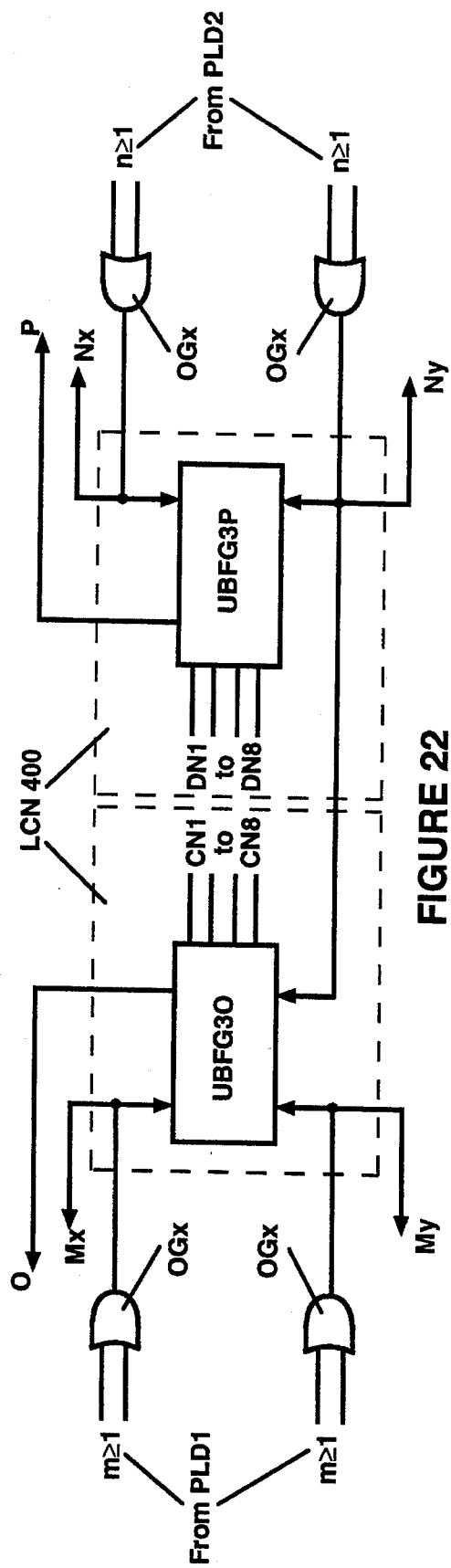

FIG. 22 shows another example of a logic combination network LCN300 employing two programmable 3-input Universal Boolean logic Function Generators UBFG3O and UBFG3P. The function generator UBFG3O receives a triplet of logic inputs comprising the outputs Mx,My from two different OR gates OGx and OGy of PLD1 and the output Ny from the OR gate OGy of PLD2. The function generator UBFG3P receives a triplet of logic inputs comprising the outputs Nx,Ny from the two different OR gates OGx and OGy of PLD2 and the output Mx from the OR gate OGx of PLD1. The OR gates OGx and OGy need not be associated with the same width FAND array in each of PLD1 and PLD2 nor need the OR gates OGx and OGy be associated with adjacent FAND arrays of PLD1 and/or PLD2. Construction of the generators UBFG3O and UBFG3P is readily derived from FIG. 3 adapted to provide for decoding of a logic input triple (instead of a pair) which involves use of 8 (instead of 4) user programmable control inputs CN1 ... CN8 and DN1 ... DN8 (connected to row lines RL0–RL7) and eight associated decode gates.

Figure 23:
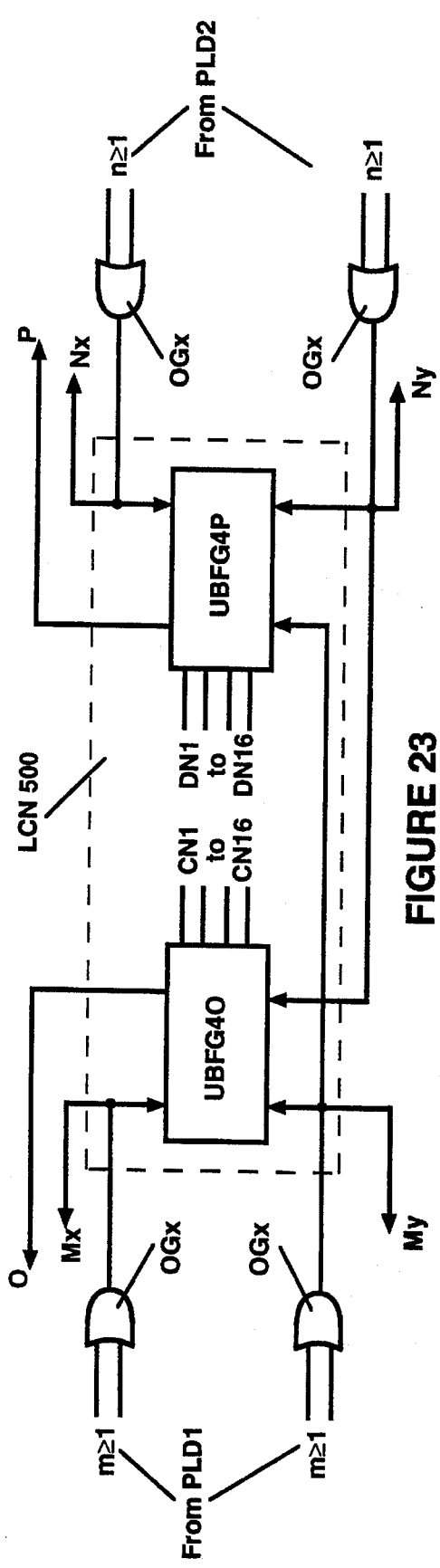

FIG. 23 shows a further example of a logic control network LCN400 employing two programmable 4-input Boolean logic function generators UBFG4O and UBFG4P. Each of the function generators UBFGO and UBFG4P receives a quadruplet of logic inputs comprising the outputs Mx,My from two different OR gates OGx and OGy of PLD1 and the outputs Nx,Ny from the OR gates OGx and OGy of PLD2. The OR gates OGx and OGy need not be associated with the same width FAND arrays in each of PLD1 and PLD2 nor need the OR gates OGx and OGy be associated with adjacent FAND arrays of PLD1 and/or PLD2. Construction of the generators UBFG4O and UBFG4P is readily derived from FIG. 3 adapted to provide for decoding of a logic input quadruple (instead of a pair) which involves use of 16 (instead of 4) user programmable control inputs CN1 ... CN16 and DN1 ... DN16 (connected to row lines RL0 ... RL15) and sixteen associated decode gates.

It will be appreciated that the interconnections within and between the programmable logic devices PLD1 and PLD2 described with reference to FIGS. 22 and 23 permit the creation of even more complex logic signals. Logic combination networks such as described with reference to FIGS. 19–23 may be used to connect various of the FAND arrays in a pair of programmable logic devices PLD1 and PLD2 to provide a configurable logic network capable of user programmation both within PLD1 and PLD2 as well as of the logic combination networks LCN, to perform a wide variety of logic functions at least some of which may have significant complexity.

The use of logic combination networks LCN as described above to obtain interconnections between OR gates OGx of two PLDs may be further expanded. For example, logic combination networks such as LCN400 could be connected to receive inputs from OR gates OGx of three different PLDs which might or might not be neighboring. Likewise, logic combination networks such as LCN500 might be connected to receive inputs from OR gates OGs of three or four different PLDs. Examples of particular utility for such connections may be appreciated from FIGS. 16 and 17. Thus, in the three-PLD configuration shown in FIG. 16, logic combination networks such as LCN400 or LCN500 might be used to receive inputs from all three PLDs. In FIG. 17, three input logic combination networks LCN 400 might usefully be employed at locations where three PLDs neighbor each other to receive inputs from OR gates OG in each of the three PLDs. Logic combination networks LCN500 might usefully be disposed at locations where four PLDs neighbor each other, to receive inputs from OR gates OG in each of the four PLDs. However, as earlier noted, logic inputs to any of the logic combination networks might be obtained from remotely located OR gates OG in various ones of the PLDs.

Although there are advantages associated with use of folded triangular PLD arrays, other folded configurations may be used, some of which are depicted in FIGS. 16 and 17. Also, the embodiments described above with reference to FIGS. 18–23 can be implemented with rectangular configurations for PLD1 and PLD2. In such a modified arrangement, all of the FANDs of the PLFGs would be associated with the same number of input logic pairs A,B or C,D. For example, PLD1 and PLD2 might each have a series of same width PLFGs (e.g. FAND24) or PLD1 might have PLFGs of one width (e.g. FAND10) while PLD2 might have PLFGs of a different rank (e.g. FAND16).

Furthermore, embodiments of the invention may be implemented using conventional programmable circuits to provide the logic input signals to the LCN network. Such conventional programmable circuits include Programmable Logic Arrays (PLAs), Programmable Gate Arrays (PGA) and Programmable Memory Arrays (PMA). PLAs include arrays in which a combinational logic network implements either a sum of products or a product of sums decomposition of logic functions. PLAs may be factory or field programmable. PGAs are based on factory programmation of uncommitted logic gates to provide a collection of desired logic functions. A PMA is based on building blocks requiring $2^n$ bits of memory for n logic inputs for implementing any logical function of the n inputs.

The control inputs CN1 ..., DN1 ... to the logic combination networks LCN which are programmable may conveniently be derived from values stored in a memory. This memory may be a user programmable volatile or non-volatile memory or factory programmable for example the same memory used to supply the programmable control inputs to the programmable cells PC2 in the programmable logic devices PLD1 and PLD2. Instead of being connected to receive signals from indicated memory cells, at least some of the control inputs CN1 ... CN4 and/or DN1 ... DN4 for any or all of LCN200, LCN300, LCN400 and LCN500 could be connected to receive inputs from a selectable one of several programmable memory cells which could be integrated in the same semiconductor chip as the overall system, and locations convenient to the particular LCN networks to which they are to provide control inputs.

Additionally, embodiments of the invention do not need to employ folded or rectangular user programmable PLDs employing PLFGs in the AND gate array as described above. Alternatively, logic network such as any of LCN100–LCN500 could be connected to receive as inputs corresponding to $M_x$, $N_x$, $M_y$, $N_x$, logic outputs from conventional programmable logic devices such as PALs or PLAs wherein an array of AND logic gates (or OR logic gates) receives logic inputs from which product terms (sum terms) are generated and applied as inputs to an array of OR logic gates (AND logic gates) to produce sums of product term outputs (product of sums term outputs) from device, either or both of the AND and OR logic gate arrays being programmable.

Additional versatility can be obtained and also still more complex user programmable configurations, by using the outputs O, P from selected as logic inputs to additional programmable Boolean function generators. Examples of such arrangements will be described with reference to FIGS. 24–29. In each of those figures, four logic combination networks LCNA . . . LCND providing logic outputs Ok, Ol, Pm, Pn are depicted. The LCNs, LCNA . . . LCND each receives logic inputs from two or more PLDs as described with reference to FIGS. 18–23.

Figure 24:
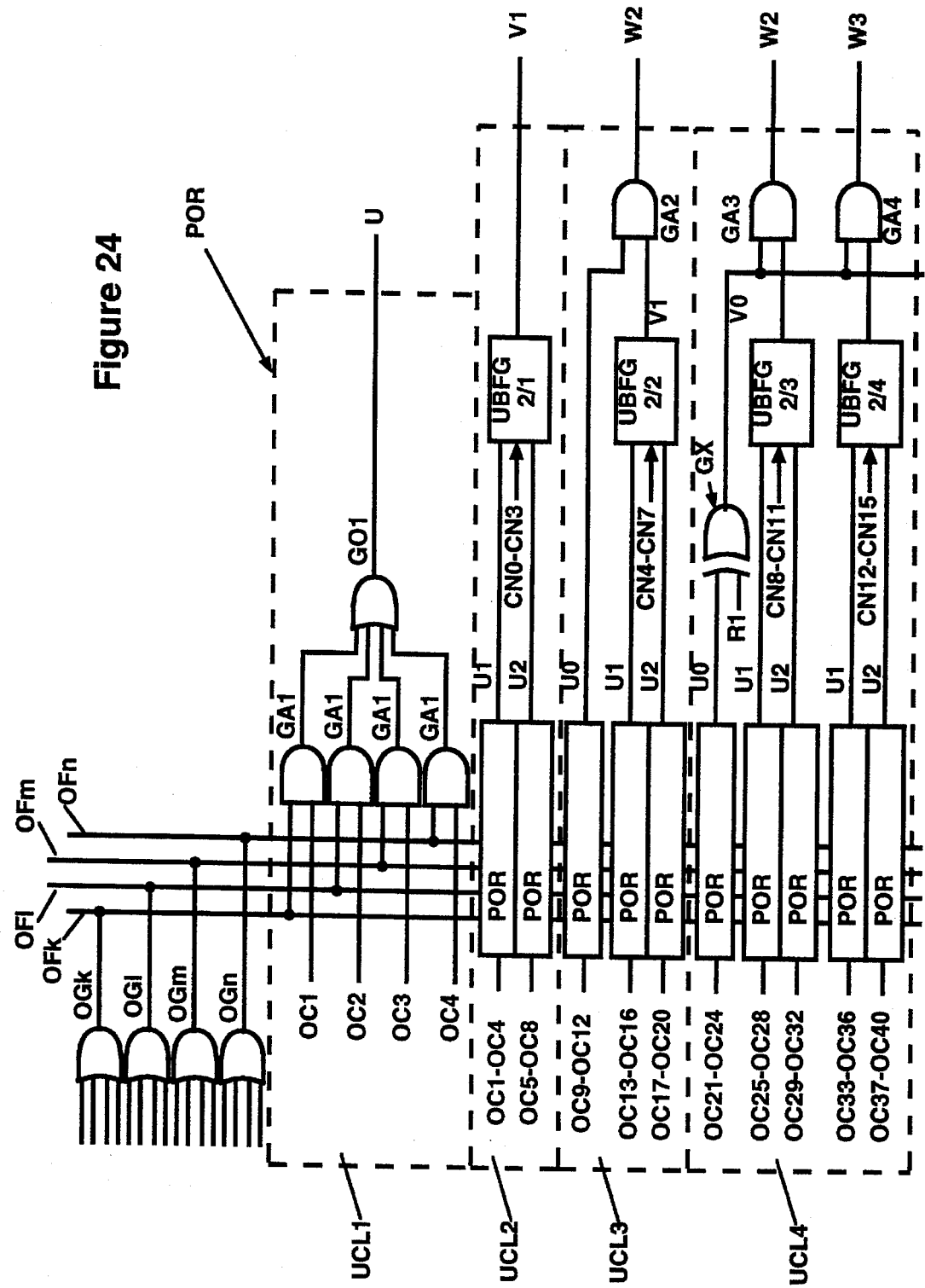

FIG. 24 depicts several different user programmable control logic circuits UCL1, UCL2, UCL3, and UCL4 to which, by way of example, the outputs Ok, Ol, Pm and Pn from logic combination networks LCN are connected to generate more complex logic outputs. The circuits UCL1–UCL4 are all shown connected to the outputs of the same LCNs for convenience of description. In practice, the control logic circuits could have as input the outputs from different LCNs.

The control logic circuit UCL1 comprises a programmable input OR gate circuit POR having four AND gates GA1 connected to receive the respective inputs Ok, Ol, Pm and Pn, together with an OR gate GO1 the inputs of which are supplied by the AND gates GA1. The AND gates GA1 also receive respective selected control input signals OC1 . . . OC4 which may be programmable. The OR gate GO1 thus produces an output signal U=Ok&OCl OR Ol&OC2 OR Pm&OC3 OR Pn&OC4.

The control logic circuits UCL2, UCL3 and UCL4 each contains two or more programmable input OR gate circuits POR which have the same configuration as in the control logic circuit UCL1, except that the control inputs OC1 . . . OC4 can be individually selected for each circuit POR.

The control logic circuit UCL2 comprises two programmable input OR circuits the outputs U1 and U2 from which provide a logic input pair for a Universal Boolean Function Generator (UBFG2/1) which may be implemented by a programmable cell PC2 and input generator IG as described with reference to FIG. 3. The input pair U1,U2 corresponds to the logic input pair A,B in FIG. 3. The UBFG2 receives programmable input signals corresponding to E00 . . . E01 in FIG. 3 on inputs CN0 . . . CN3 the programming of which determines the output $V1=F_{C_{N0} \ldots C_{N03}}(U1,U2)$ where U1 and U2 have the same form as the output U from the control logic circuit UCL1.

In the control logic circuit UCL3, the output U0 from a control circuit UCL1 and the output V1 from the UBFG2/2 of a control logic circuit UCL2 provide inputs to an AND gate GA2 to produce an output W1=U0&V1.

In the control circuit UCL4, the outputs V2 and V3 from UBFG2/3 and UBFG/4 of two control logic circuits UCL2 are applied as inputs to respective AND gates GA3 and GA4. An EXCLUSIVE-OR gate GX receives an input U0 from a control logic circuit UCL1 and an input logic signal R1 (which may be an external control signal) and has an output connected to inputs of each of the AND gates GA3 and GA4. The control logic circuit UCL4 thus produces outputs W2=V0&V1A and W3=V0&V1B, where V0=R1 XOR U0. V0 can be used to force a particular output value for W2 and W3. R1=1 effectively implements the inversion of U0 which is particularly useful. Such an implementation could be embodied using one inverter instead of the EXCLUSIVE OR gate GX.

The inputs CN0 . . . CN15 for UBFG2/1 . . . UBFG2/4 may be individually programmed or generated in a programmable fashion and, if desired, may be derived from signals stored in memory which may be programmable.

Figure 25:
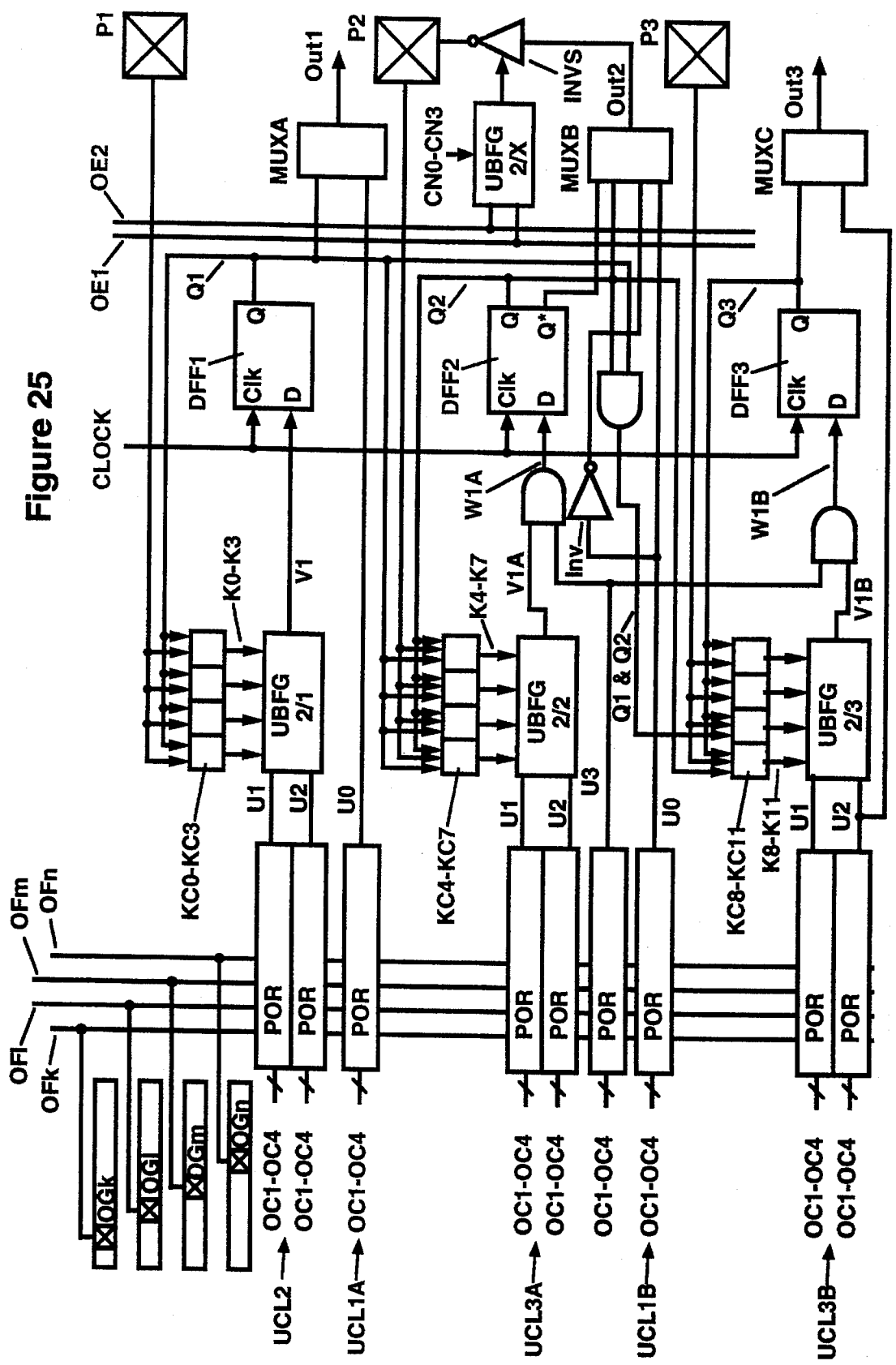

FIG. 25 depicts additional ways in which outputs O, P from LCNs interconnecting PLDs may be utilized in conjunction with logic control circuits UCL as described with reference to FIG. 24. The logic output V1 from the UBFG2/1 of a control logic circuit UCL2 is connected as an input to a temporary storage memory, shown as a D flip flop DFF1. The flip flop input is transferred to the Q output at the next clock pulse on the clock line CLOCK. Two control logic circuits UCL3A and UCL3B have AND gates which receive respective outputs ViA and V1B from UBFG2/2 and UBFGR/3 of control logic circuits UCL3A and UCL3B as well as inputs U3 from a common programmable OR gate circuit UCL1C. The logic outputs W1A and W1B from the control logic circuits UCL3A and UCL3B provide respective inputs to D flip-flops DFF2 and DFF3, also clocked by the clock line CLOCK.

The Q outputs Q1, Q2 and Q3 from the flip-flops DFF1, DFF2 and DFF3 may be used as external logic signals. Those Q outputs also may be transferred from the flip flops DFF1, DFF2 and DFF3 to programmably controlled logic signal generator cells KC0 . . . KC3 KC4 . . . KC7 and KC8 . . . KC11 which generate signals K0 . . . K3, K4 . . . K7 and K8 . . . K11 for the inputs CN0 . . . CN3 of the UBFG2/1–UBFG2/3, respectively.

Figure 26:
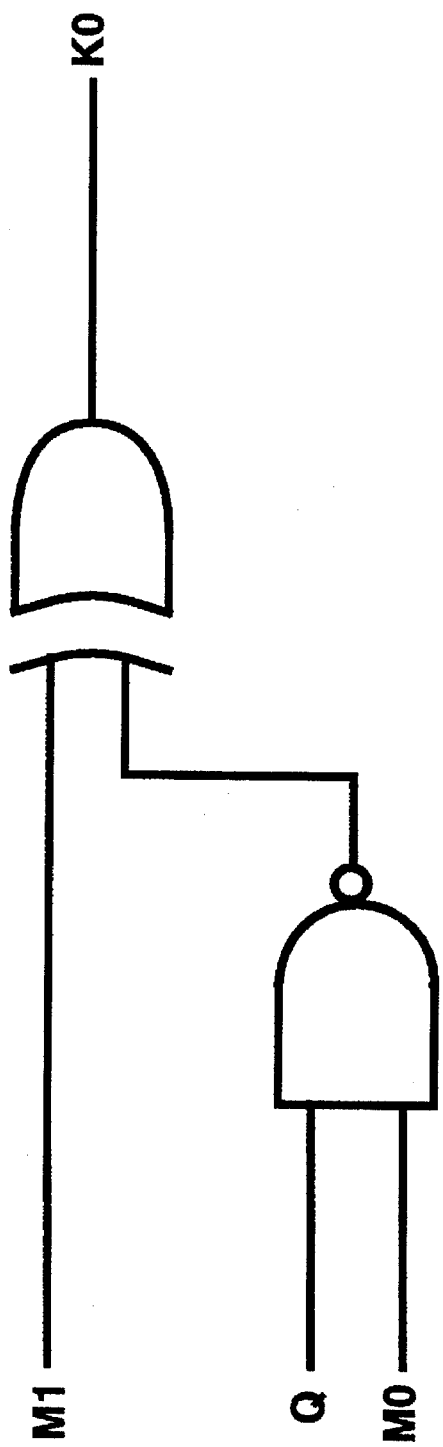

An example of a suitable programmably controlled logic Signal generator cell K for the cells KC0 . . . KC3 is illustrated in FIG. 26 and comprises an EXCLUSIVE OR gate having a first input connected to receive the logic signal value M1 from a programmable memory cell. A NAND gate having two inputs, one connected to receive the logic signal value M0 from a programmable memory cell and a second input connected to receive the Q output from the flip flop DFF1. The output KO from the cell K is thus determined according to:

| M0 | M1 | K0 |
| --- | --- | --- |
| 0 | 0 | 1 |
| 0 | 1 | 0 |
| 1 | 0 | Q1* |
| 1 | 1 | Q1 |

As thus far described, the control inputs K0 . . . KC3 for UBFG2/1 from the cells KC0 . . . KC3 could thereby each be selected from: K0 . . . K3 ∈ {0,1,Q1,Q1*} using logic signal values M0 and M1 stored in programmable memory cells as selection signals applied to each one of the cells KC0 . . . KC3.

In addition, external logic signals may also be supplied from a port P1 (for example a terminal pin on a semiconductor chip on which the PLD(s) and control logic circuitry are integrated) and used to enter values as input signals to the programmably controlled logic signal generator cells KC0 ... KC3 for providing the control inputs K0 ... K3 to UBFG2/1. The control inputs K0 ... K3 for UBFG2/1 of the control logic circuit UCL2 then could be selected from: K0 ... K3 ∈ {0,1,Q1,Q1*,P1}, using as selection signals, values M0, M1 and M2 stored in programmable memory cells. These programmably controlled logic signal generator cells could be designed using conventional design procedures and would implement the following truth table:

| M0 | M1 | M2 | K0 |
|----|----|----|----|
| 0 | 0 | 0 | 0 |
| 0 | 0 | 1 | 1 |
| 0 | 1 | 0 | Q1* |
| 0 | 1 | 1 | Q1 |
| 1 | 0 | 0 | P1 |

UBFG2/2 and UBFG2/3 of the control logic circuits UCL3A and UCL3B also receive at their inputs CN0 ... CN3 signals K4 ... K7 and K8 ... K11 from programmably controlled logic generator cells KC4 ... KC7 and KC8 .. . KC11, respectively. Cells KC6, KC7, KC10 and KC11 are designed and controlled in a similar manner to the cells KC0 ... KC3 as described above, with cells KC6, KC7 receiving inputs Q2 from the flip flop DFF2 and from the external pin P2 while the cells KC10 and KC11 receive inputs Q3 from the flip flop DFF3 and from the external pin P3.

The logic generator cells KC4 and KC8 also receive Q1 from the flip flop DFF1 and Q2 from the flip flop DFF2, respectively, as SHIFT inputs. Q1 also is applied as a COUNTER propagation input to the function cell KC5 while the ANDED signal Q1&Q2 is applied as a COUNTER propagation input to the cell KC9.

The inputs K4 and K8 generated by the logic signal generator cells KC4 and KC8 for UBFG2/2 and UBFG2/3 of the control logic circuits UCL3A and UCL3B then could be selected from: K4 ∈ {0,1,Q2,Q2*,SHIFT,P2}, and K8 ∈ {0,1,Q3,Q3*,SHIFT,P3}, using as selection signals, values M0, M1 and M2 stored in programmable memory cells. The programmably controlled logic signal generator cells KC4 and KC8 could be designed using conventional design procedures to implement the following truth table:

| M0 | M1 | M2 | K0 |
|----|----|----|----|
| 0 | 0 | 0 | 0 |
| 0 | 0 | 1 | 1 |
| 0 | 1 | 0 | Q2* |
| 0 | 1 | 1 | Q2 |
| 1 | 0 | 1 | P |
| 1 | 1 | 0 | SHIFT |

Shifting operations performed using KC4/KC8 type logic generator cells in the manner described above enable the temporary stores DFF1, DFF2 and DFF3 to be loaded from one pin Px by a succession of clocked operations. This allows the implementation of Parallel-In-Serial-Out and Serial-In-Parallel-Out shift registers to be functionally integrated into one circuit. This circuit can then be used to process these signals for functions such as Boolean polynomial calculations, which are extensively used in implementing Error Detection and Correction Coding schemes.

Similarly, the inputs K5 and K9 generated by the cells KC5 and KC9 for UBFG2/2 and UBFG2/3 of the control logic circuits UCL3A and UCL3B could be selected from: K5 ∈ {0,1,Q2,Q2 ,COUNT XOR Q2,P2}, and K9 ∈ {0,1, Q3,Q3*,COUNT XOR Q3,P3}, using as selection signals, values M0, M1 and M2 stored in programmable memory cells. The programmably controlled logic signal or generator cells KC5 and KC9 could be designed using conventional design procedures to implement the following truth table:

| M0 | M1 | M2 | K0 |
|----|----|----|----|
| 0 | 0 | 0 | 0 |
| 0 | 0 | 1 | 1 |
| 0 | 1 | 0 | Q* |
| 0 | 1 | 1 | Q |
| 1 | 0 | 0 | P |
| 1 | 0 | 1 | COUNT XOR Q |

Thus, counter functionality can be obtained by connecting additional UCL3-type stages and their associated D flip flops and function cells corresponding to KC8 ... KC11, with the KC9 type programmable function cells receiving inputs derived from the D flip flop of that stage and from the D flip flop of the preceding stage in the manner shown in FIG. 25 for an Up Counter function. Down Counter and Up/Down Counter functions can be obtained by appropriate changes in the connections between the Q and Q* outputs from the D flip flops to the KC9 type programmable logic generator cells of neighboring stages. The counter functions are described according to the following relations:

Assume an $n$-bit counter with bits $Q1, \ldots Qn$;
Count Up:

$$Qi(\text{next}) = Qi(\text{now}) \text{ XOR CountUp}i$$
$$\text{CountUp}i = 1 \text{ if } i = 1$$
$$= Q1 \& Q2 \& \ldots Qi-1 \text{ if } i > 1$$

Count Down:

$$Qi(\text{next}) = Q1(\text{now}) \text{ XOR CountDown}i$$
$$\text{CountDown}i = 1 \text{ if } i = 1$$
$$= Q1* \& Q2* \& \ldots Qi-1* \text{ if } i > 1$$

Count Up/Down (UpDown Controlled):

$$Q1(\text{next}) = Qi(\text{now}) \text{ XOR CountUpDown}i$$
$$\text{CountUpDown}i = \text{CountUp}i \& \text{UpDown OR}$$
$$\text{CountDown}i \& \text{UpDown}*$$

Additional versatility of the configurable network as thus far described with reference to FIG. 25 can be obtained in the following manner. The Q outputs from any or all of the flip flops DFF1, DFF2 and DFF3 and the outputs from programmable OR gates POR may be used to provide external logic signals. As shown in FIG. 25, the DFF1 flip flop output Q1 and the logic signal U0 from an additional control circuit UCL1A are applied as inputs to a 2-to-1 multiplexer MUXA. Alternatively, the Q output from a flip flop and the output from a programmable OR gate of a UCL3-type control circuit could be applied as inputs to a multiplexer. This is illustrated in FIG. 25 by the connection of the Q3 output from the flip flop DFF3 and of the U2 output from a programmable OR gate of the control circuit UCL3B to a 2-to-1 multiplexer MUXC. For greater flexibility, a flip flop Q output and a logic signal output from a programmable OR gate together with their inverted values could be applied as inputs to a 4-to-1 multiplexer to provide for output signal polarity selection. Thus, in FIG. 25, the multiplexer MUXB receives the Q2 and Q2* outputs from the flip flop DFF2 while a logic signal U0 from an additional programmable OR gate UCL1B is applied directly and via an inverter INV as inputs to the multiplexer MUXB.

FIG. 25 also includes circuitry permitting a multiplicity of enable inputs to be used to select connection of the output from a multiplexer to an external pin. Thus, the output from the multiplexer MUXB is connected via a switched inverter INVS to the external pin P2. An enable input for the inverter INVS is provided by an Universal Boolean Function Generator UBFG2/X implemented as described with reference to FIG. 3. Output enable signals OE1 and OE2 provide the logic input signals to UBFG2/X (equivalent to logic signals A and B in FIG. 3) and the signals to inputs CN0 . . . CN3 may be provided by values which may be stored in a programmable memory, in the same manner as the stored values E00 . . . E01 in FIG. 3.

In this manner, any of the sixteen Boolean Functions of OE1 and OE2 are available for selecting connection of the output from the multiplexer MUXB to the external pin P2. Similar output enable selection circuitry could also be used in conjunction with other output selection multiplexers such as MUXA and MUXC.

Depending on the logic signals U1 and U2 input to the UBFG2/1, the logic signals K0, K1, K2 and K3 are selectively transferred from input to the output of the UBFG2/1. The output signal V1 of UBFG2/1 serves as the data input signal to the D flip flop DFF1. The signal generators KC0 . . . KC3 of K0, K1, K2 and K3 each possess a selector which is controlled by the state of the associated three bits of memory denoted as M0, M1 and M2. When DFF1 is clocked, the state of the D flip flop is set to whichever one of these signals is present at the output of UBFG2/1. When the new state of the D flip flop has become stable and propagated to the Q output of the D flip flop, it is transmitted to the programmable signal generators KC0, KC1, KC2 and KC3. Changes in this Q signal then propagate through the circuitry of these signal generators KC0 and KC3 and when the affected internal signals are selected for output, thus affect the output signals generated by KC0 to KC3.

Likewise, changes in the state of the logic signal present on the pin P1 can propagate through the signal generators KC0 to KC3 to affect the data input to the D flip flop DFF1, which makes it possible to load the pin state without using up the PLD resources to transfer the pin state to the D flip flop. Thus, the PLD resources are used to determine what signal activity involving the D flip flop is to be engaged and specialized circuitry is then invoked to perform the selected activity.

Figure 27:
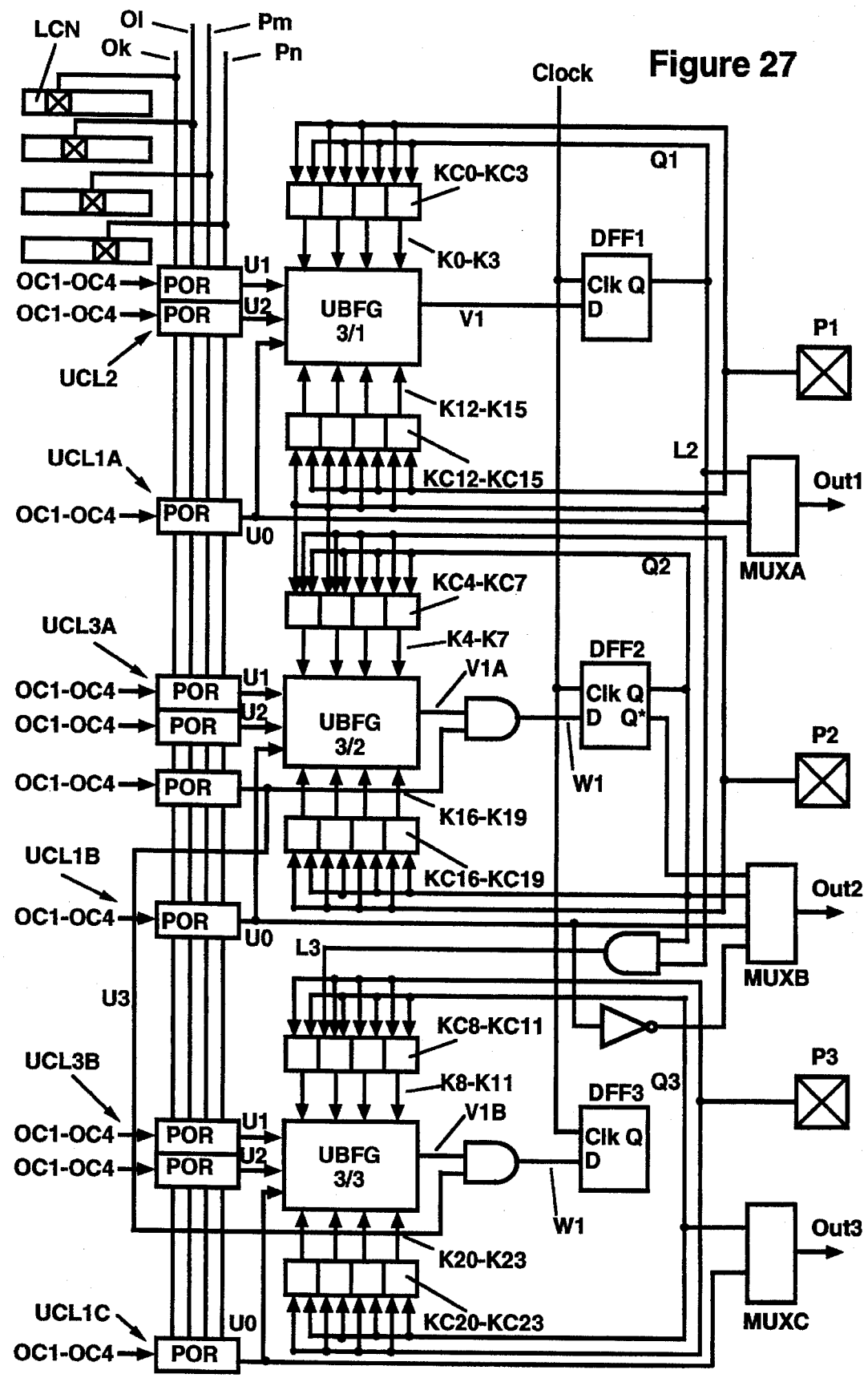

FIG. 27 shows an arrangement similar to that shown in FIG. 25 but employing three—logic—input Universal Boolean Function Generators UBFG3 in place of the two—logic—input generators UBFG2 as shown in FIG. 25. As previously explained, this three input Boolean function generator requires eight control input signals to achieve full logic decoding of the three input signals. Thus, in FIG. 27, UBFG3/1. UBFG3/2 and UBFG 3/3 of the control logic circuits UCL2, UCL3A and UCL3B receive an additional logic input U0 from respective control logic circuits UCL1A, UCL1B and UCL1C. The necessary four additional signals K12 . . . K15, K16 . . . K19, and K20 . . . K23 for each of these UBFGs are provided by additional groups of programmably controlled logic signal generator cells KC12 . . . KC15, KC16 . . . KC19, and KC20 . . . KC23, respectively.

Figure 28:
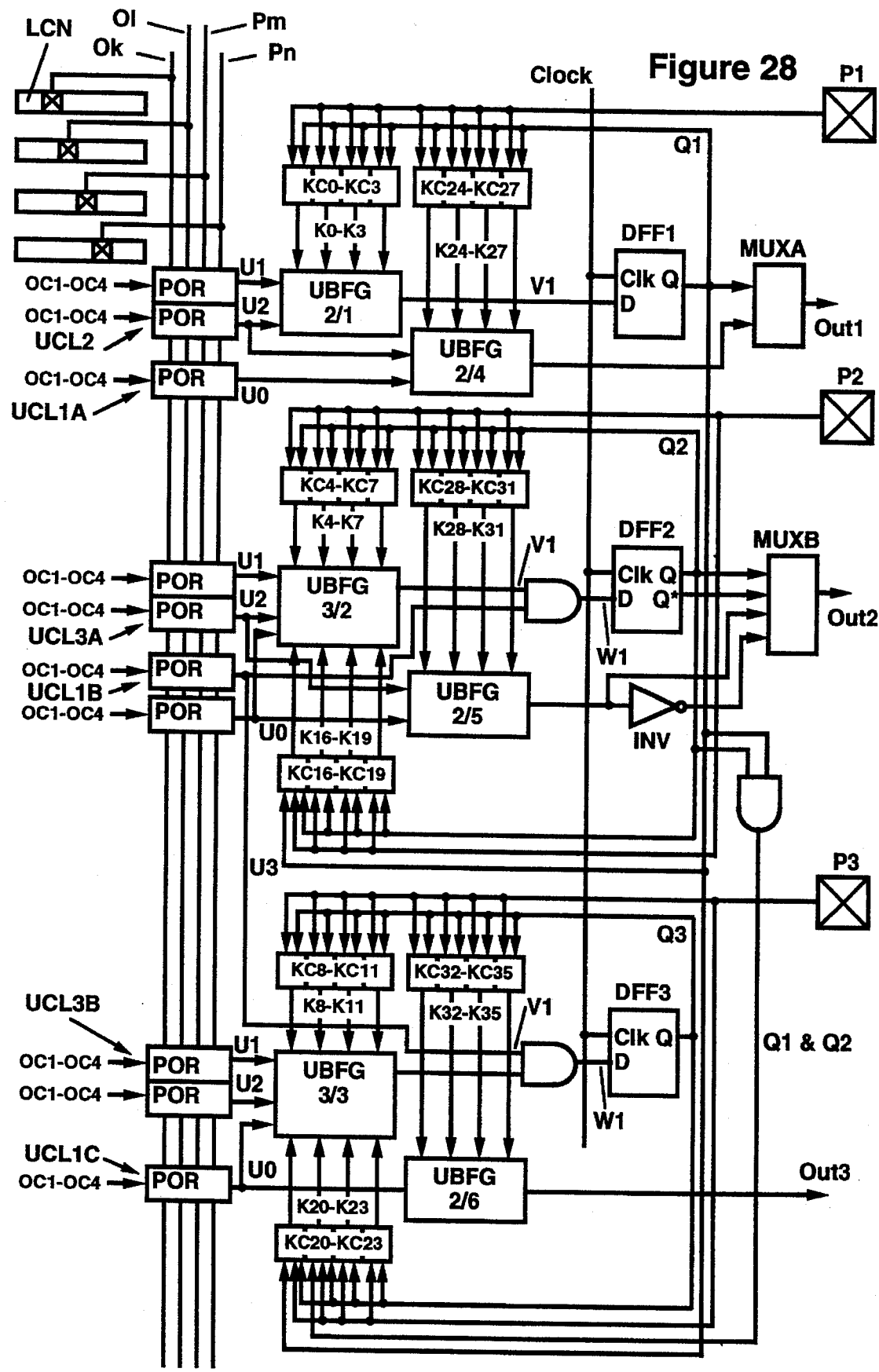

FIG. 28 shows further extensions of the arrangement shown in FIG. 27. Instead of connecting the logic output U3 from the control logic circuit UCL1A directly to the multiplexer MUXA, it is connected to provide one of a pair of logic inputs to a two—logic—input Universal Boolean Function Generator UBFG2/4. The output U2 from the control logic circuit UCL2 provides the second logic input for UBFG2/4 while the output from UBFG2/4 is connected to an input of the two-to-one multiplexer MUXA. A set of four programmably controlled logic signal generator cells KC24 . . . KC27 are connected to provide signals to the inputs CN0 . . . CN3 for the UBFG2/4. The logic generator cells KC24 . . . KC27 receive a Q input from the flip flop DFF1 and an external pin input from pin P1. (It should be noted that whereas in FIG. 27 UBFG3/1 of the control logic circuit UCL2 has three logic inputs, it is shown in FIG. 28 as a generator UBFG2/1 having two logic inputs.

Also in FIG. 28, the multiplexer MUXB is shown as receiving true and inverted outputs from a two-logic input Universal Boolean Function Generator UBFG2/5 connected (in a manner analogous to UFBG2/4) to receive as inputs, the logic control signal U0 from the control logic circuit UCL1B and the logic output signal U2 from the control logic circuit UCL3A. Control signals K28 . . . K31 for UBFG2/5 are derived from four programmably controlled logic signal generator cells KC28 . . . KC31 which receive Q2 and P2 inputs from the flip flop DFF2 and the external pin P2.

FIG. 28 also shows an alternative manner of selecting output signals that can be used instead of multiplexers. For example, the multiplexer MUXC of FIG. 27 is replaced in FIG. 28 by a Universal Boolean Function Generator UBFG2/6 connected to receive one logic input signal U0 from the control logic circuit UCL1C, the second logic input signal being provided by the Q3 output from the flip flop DFF3. A group of programmably controlled logic function cells KC32 . . . KC35 receive Q3 and P3 inputs from the flip flop DFF3 and the external pin P3, respectively. The logic signals output from those logic signal generator cells are connected to provide control input signals K32 . . . K35 for control inputs CN0 . . . CN3 of the UBFG2/6. This arrangement provides additional versatility compared with use of a multiplexer for output signal selection.

Figure 29:
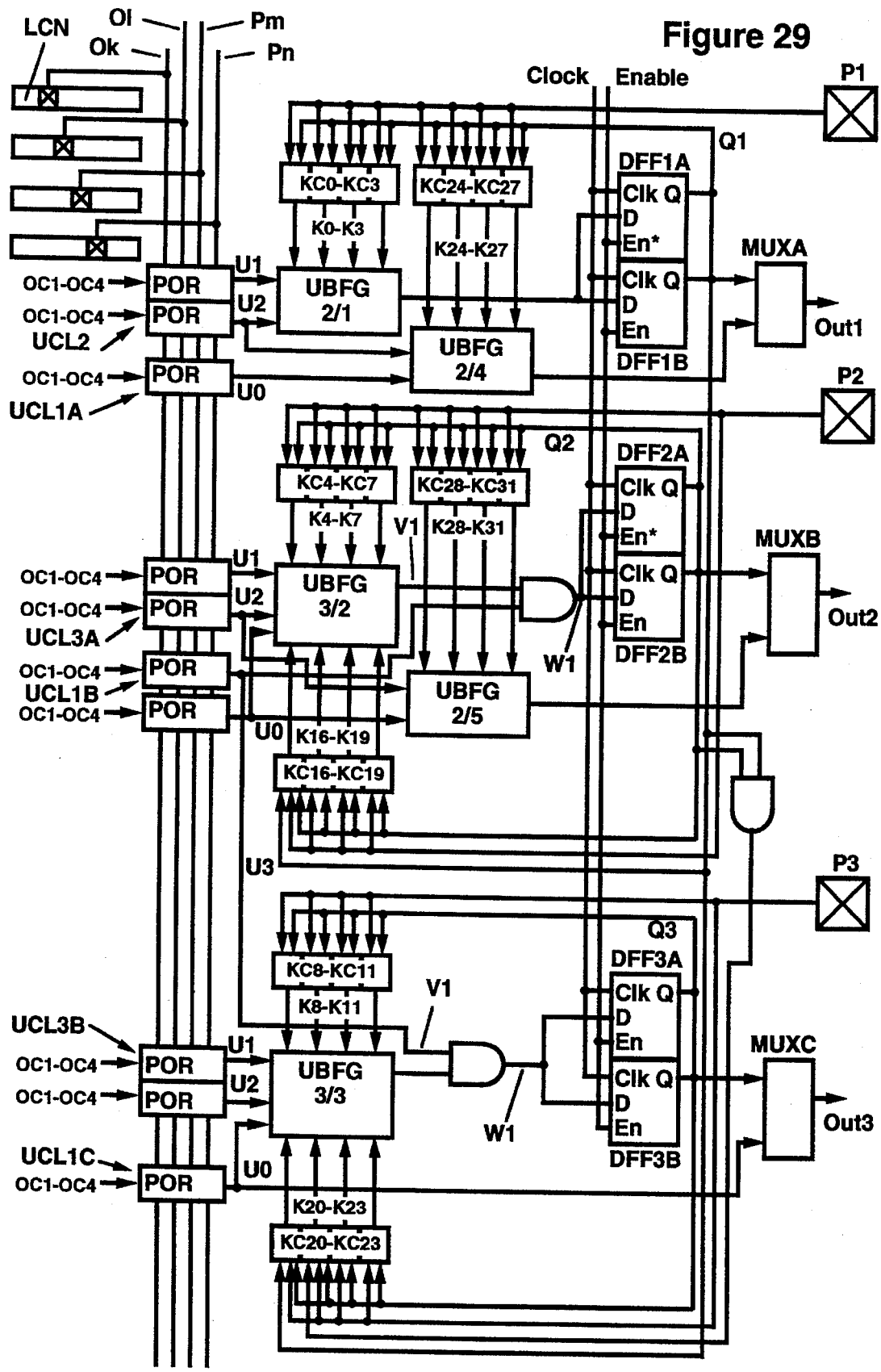

FIG. 29 illustrates a further development of the arrangement shown in FIG. 28 in which pairs of temporary stores or registers, e.g., D flip flops DFF1A,DFF1B; DFF2A, DFF2B; and DFF3A,DFF3B replace individual flip flops. The output V1 from the UBFG2/1 of the control logic circuit UCL2 is connected to provide D inputs to the flip flop pair DFF1A,DFF1B while the outputs W1 from the AND gates of the control logic circuits UCL3A and UCL3B are connected to provide D inputs to the flip flop pairs DFF2A, DFF2B and DFF3A,DFF3B, respectively. The states of the D inputs of the flip flops DFF1B, DFF2B and DFF3B are transferred to their Q outputs by clock signals on the clock line CLOCK when those flip flops are enabled by signals EN applied over the ENABLE line. Similarly, the states of the D inputs of the flip flops DFF1A, DFF2A and DFF3A are transferred to their Q outputs by clock signals on the clock line CLOCK when those flip flops are enabled by signals EN, applied over the ENABLE line.

The Q outputs from both flip flops DFF1A and DFF1B are connected to the output line Q1; the Q outputs from the flip flops DFF2A and DFF2B are connected to the output line Q2; and the Q outputs the flip flops DFF3A and DFF3B are connected to the output line Q3. In this manner, connection of the Q outputs from the flip flops to their associated output multiplexer and to their associated function cells can be selected either by the EN signals or by the EN*, signals.

In relation to FIGS. 27–29, the logic generator cells KC12 . . . KC35 can be implemented in a similar manner as the function cells KC0 . . . KC3.

It will be appreciated that the control signals M0, M1, etc. for the programmably controlled logic signal generator cells KC0 . . . KC35 can be provided by values stored in memory cells, which may be programmable and individual to each particular function cell.

In FIGS. 24–29 a variety of programmable logic function networks have been shown for connection to receive logic inputs derived from two programmable logic devices interconnected by logic control networks such as, for example, depicted in FIG. 18.

However, the O, P outputs from the circuits LCN may be derived from more than two PLDs, as previously explains. Individual ones of the various networks shown in the respective FIGS. 24–29 may be selected as required to provide a particular overall logic function network in conjunction with the PLDs interconnected in the LCNs which provide their logic inputs Ok, Ol, Pm, Pn. Although four logic inputs derived from LCNs have been shown by way of example, this is not critical. However, increases in the number of inputs would increase the complexity of the programmable OR circuits POR. [Moreover, it is not essential that all of the POR circuits of the UCL networks shown in FIGS. 25–30 receive the same four logic inputs Ok, Ol, Pm, Pn.] An example of a configurable logic network embodying the invention might include two programmable logic devices PLDA and PLDB, arranged in a rectangular configuration as indicated in FIG. 16. Selected OR gates OG of one programmable logic device PLDA and selected OR gates OG of the programmable logic device PLDB could be connected to logic control networks selected from networks such as LCN100, LCN200 and LCN400 as shown in FIGS. 19, 20, 22 and 23.

Figure 30:
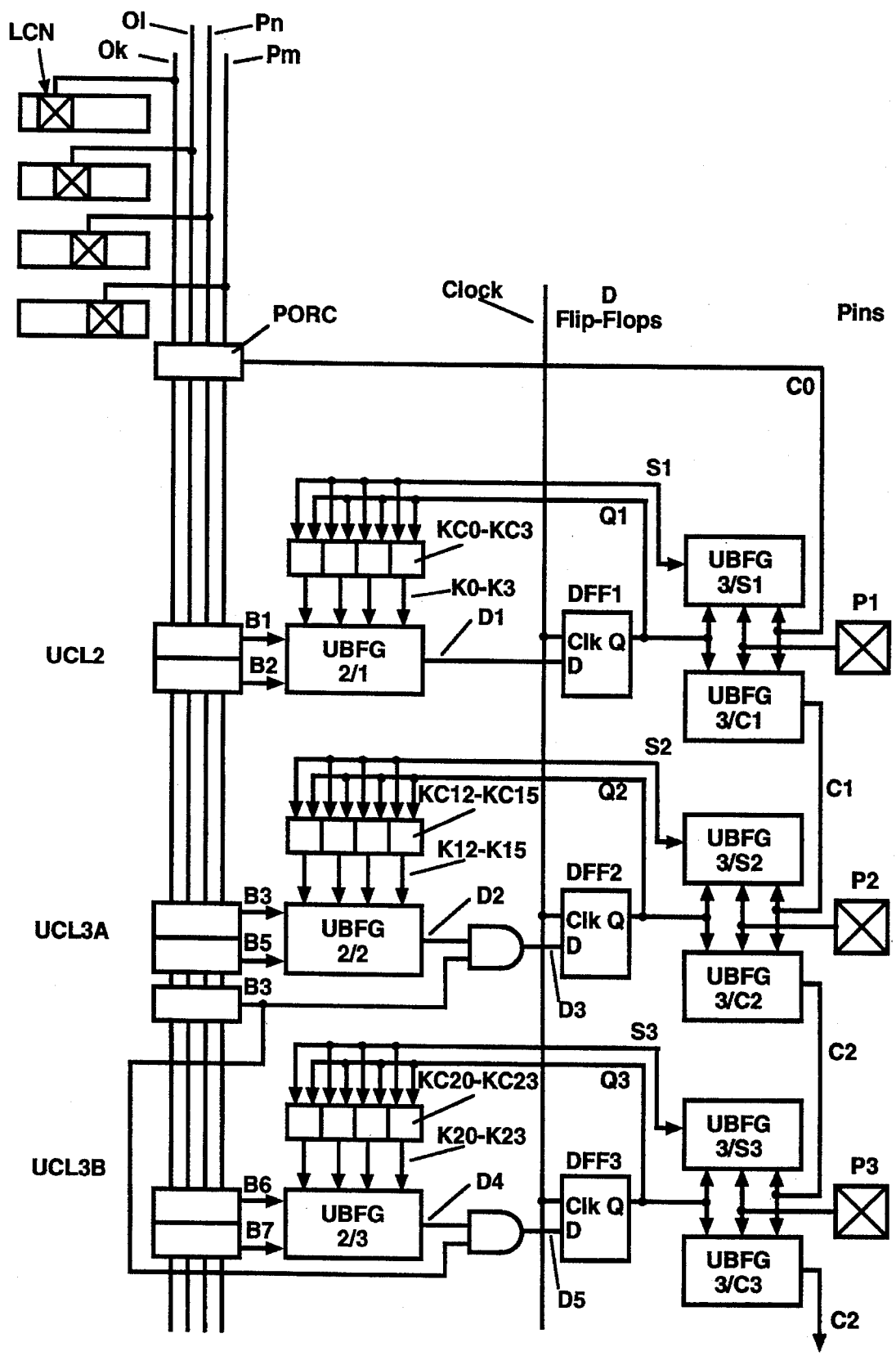
FIG. 30 depicts a combinatorial network which can implement counting, addition and shifting with ripple-style carry propagation, the execution of which is controlled by the PLD outputs.

FIG. 30 depicts a multipurpose logic circuit employing UCL2, UCL3A and UCL3B stages, and associated temporary data registers DFF1, DFF2 and DFF3 strobed by the CLOCK signal and connected and operating in the manner described with reference to FIG. 25. The Q output of the flip flop DFF1 is also connected to provide first logic input to each of a pair of three logic input Universal Boolean Function Generators UBFG3/S1 and UBFG3/C1, a second logic input to both generators being provided from an external port P1.

The Q outputs of the flip flops DFF2 and DFF3 are similarly connected as the first logic inputs to UBFG3/S2, UBFG3/C2 and UBFG3/S3, UBFG3/C3, respectively, which receive second logic inputs from external ports P2 and P3 respectively.

Then UBFG3 generators are implemented in a similar manner to the IG/PC2 circuit described with reference to FIG. 2, modified so that the IG circuit provides the minterm set of three logic inputs as input signals to eight AND gates in the programmable cell. The AND gates also receive programmable inputs which can be selectively connected on outputs from the generator as a function of the three logic signal inputs to the programmable logic cell.

The third logic input CO to the UBFG3/S1 is provided by its output from a programmable OR circuit PORC (constructed as shown in FIG. 24) which receives logic inputs Ok, Ol, Pn and Pn derived from LCNs as previously described. The outputs from UBFG3/C1 and UBFG3/C2 provide third logic inputs to UBFG3/S2, UBFG3/C2 and UBFG3/S3, UBFG3/C3 respectively.

Logic outputs S1, S2 and S3 from UBFG3/S1,S2,/S3 are connected as inputs to the programmable logic signal generators KC0 . . . KC3; KC4 . . . KC7; and KC8 . . . KC11, respectively. These logic signal generator groups implement the following signal table in which Si represents the output from the UBFG3/Si, i=1, 2, 3 . . .

| M0 | M1 | M2 | K0 |
|---|---|---|---|
| 0 | 0 | 0 | 0 |
| 0 | 0 | 1 | 1 |
| 0 | 1 | 0 | Q |
| 0 | 1 | 1 | Q* |
| 1 | 1 | 1 | Si |

Each UBFG3/Si has a set of control signals SCN0 . . . SCN7 and produces an output from these control signals derived from any selected function of the logic input signals $C_{i-1}$, $Q_i$ and $P_i$. Similarly, each UBFG3/C: has a set of control signals CCN0 . . . CCN7 and produces an output signal Ci from those control signals derived from any selected function of the logic input signals $C_{i-1}$, $Q_i$ and $P_i$.

The control signals SCN0 . . . SCN7 and CCN0 . . . CCN7 respectively can be shared between UBFG3/Si generators and UBFG3/Ci generators in two or more stages. Alternatively, the control signals can be provided locally to the UBFG3/Si and UBFG3/Ci generators of a particular stage, for example by a group of programmable memory cells integrated in the same semiconductor chip as the generator and located at a conveniently accessible location.

Let the following formulae define the output signal of the generators UBFG3/Si and UBFG3/Ci respectively:

$Si = SCN0$ & $Q_i^*$ & $P_i^*$ & $C_{i-1}^*$ or SCN1 & $Q_i^*$ & $P_i^*$ & $C_{i-1}$
or SCN2 & $Q_i^*$ & $P_i$ & $C_{i-1}^*$
or SCN3 & $Q_i^*$ & $P_i$ & $C_{i-1}$
or SCN4 & $Q_i$ & $P_i^*$ & $C_{i-1}^*$
or SCN5 & $Q_i$ & $P_i^*$ & $C_{i-1}$
or SCN6 & $Q_i$ & $P_i$ & $C_{i-1}^*$
or SCN7 & $Q_i$ & $P_i$ & $C_{i-1}$ $Ci = CCN0$ * $Q_i^*$ & $P_i^*$ & $C_{i-1}^*$
or CCN1 & $Q_i^*$ * $P_i^*$ & $C_{i-1}$
or CCN2 & $Q_i^*$ & $P_i$ & $C_{i-1}^*$
or CCN3 & $Q_i^*$ & $P_i$ & $C_{i-1}$
or CCN4 & $Q_i$ & $P_i^*$ & $C_{i-1}^*$
or CCN5 & $Q_i$ & $P_i^*$ & $C_{i-1}$
or CCN6 & $Q_i$ & $P_i$ & $C_{i-1}^*$
or CCN7 & $Q_i$ & $P_i$ & $C_{i-1}$

Consider the SCN0-7 and CCN0-7 signals as being shared amongst the UBFG3/Si and UBFG3/Ci generators. The following functions of $Q_i$, $P_i$ and $C_{i-1}$ will implement incrementing where CO is assumed to be 1:

$$\begin{aligned}
Si &= Qi\ XOR\ Ci-1 \\
&= QI\ \&\ Ci-1^*\ or\ Qi^*\ \&\ Ci-1 \\
&= Qi\ \&\ Pi\ \&\ Ci-1^*\quad or\ Qi\ \&\ Pi^*\ \&\ Ci-1^* \\
or\ &Qi^*\ \&\ Pi\ \&\ Ci-1^*\quad or\ Qi^*\ \&\ Pi^*\ \&\ Ci-1 \\
Ci &= Qi\ \&\ Ci-1 \\
&= Qi\ \&\ Pi\ \&\ Ci-1\quad or\ Qi\ \&\ Pi^*\ \&\ Ci-1
\end{aligned}$$

for $i = 1, 2, 3, \ldots$

The following functions of $Q_i$, $P_i$ and $C_{i-1}$ implement addition with CO as carry input:

$$\begin{aligned}
Si &= Qi\ xor\ Ci-1\ xor\ Pi \\
&= Qi^*\ \&\ (Ci-1\ xor\ Pi)\ or\ Qi\ \&\ (Ci-1\ xor\ Pi)^* \\
&= Qi^*\ \&\ Pi^*\ \&\ Ci-1\quad or\ Qi^*\ \&\ Pi\ \&\ Ci-1^* \\
or\ &Qi\ \&\ Pi\ \&\ Ci-1\quad or\ Qi^*\ \&\ Pi^*\ \&\ Ci-1^*
\end{aligned}$$

-continued $$C_i = Q_i \& C_{i-1} \text{ or } Q_i \& P_i \text{ or } C_{i-1} \& P_i$$
$$= Q_i \& P_i \& C_{i-1}$$
$$\text{or } Q_i \& P_i \& C_{i-1}*$$
$$\text{or } Q_i \& P_i* \& C_{i-1}$$
$$\text{or } Q_i* \& P_i \& C_{i-1}$$

for $i = 1, 2, 3, \ldots$

The following functions i, Pi and Ci-1 implement shift right with CO as shift input:

$$S_i = C_{i-1}$$

$$C_i = Q_i$$

for $i = 1, 2, 3, \ldots$

The above arithmetic operations can be readily coded into the SSCN0 to SSCN7 and CCN0 to CCN7 control values of 0 and 1.

The discussion so far has focused on shared control bits for the SCN and CCN signals. By using some locally integrated memory to generate each SSCN and CCN control signal uniquely, the configuration can be programmably determined so that different logic operations can be performed by each of the UBFG3/Si and UBFG3/Ci generators.

Figure 31:
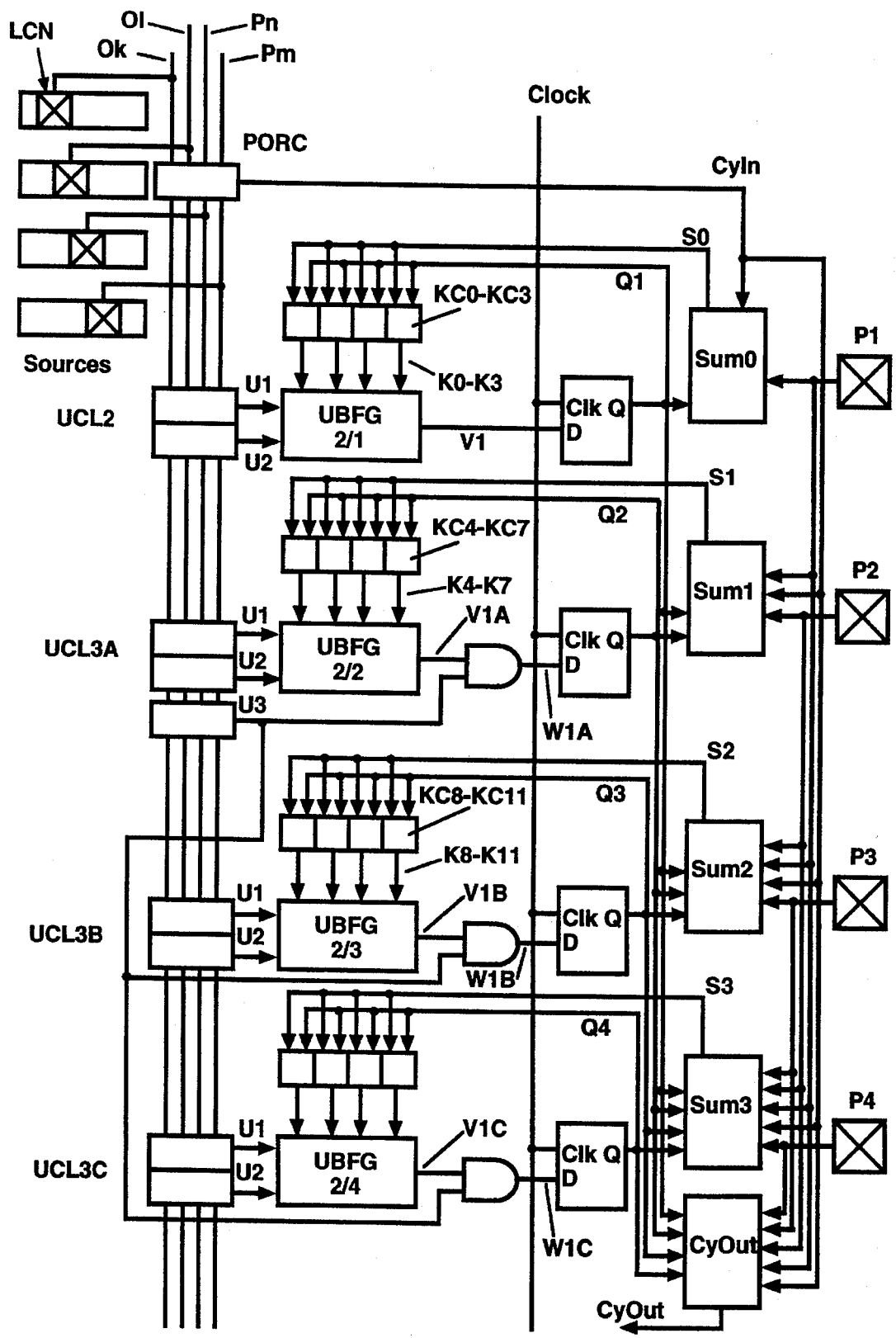
FIG. 31 depicts a combinatorial circuitry which implements a carry lookahead style adder controlled by the outputs of the PLD.

FIG. 31 depicts a modification of FIG. 30 in which the UBFG3/Si and UBFG3Ci pairs are replaced by dedicated, fixed logic adder stages SUM0, SUM1, SUM2 and a third adder stage SUM3 incorporated together with a Carry Out Stage $Cy_x$ Out. The SUM0 stage receives inputs from the Q output of the flip flop DFF1, P1 port, and a Carry In $Cy_x$ In signal derived from the programmable OR circuit PORC as described with reference to FIG. 30, and generates an output logic signal SO connected as an input to the logic signal generators KC0.KC3.

The stages SUM1, SUM2 and SUM3 are similarly structured to SUM0 but in addition receives Q and P logic inputs from each of the preceding stages as well as the Carry In signal $Cy_x$ In.

The Carry Out stage $Cy_x$ Out receives the same input signals as the SUM3 stage and generates a Carry Out signal Cy Out.

Operation of the circuit shown in FIG. 31 may be readily derived from the functional equations describing the operation of FIG. 30, given above, and taking into consideration that for FIG. 31, Si is the ith bit of the 2's complement sum of the Q bit vector with the P vector, given CO as the Carry Input signal $Cy_x$ In.

By use of dedicated adder logic stages as described with reference to FIG. 31, significantly faster operation can be obtained compared with operation of FIG. 30 as an adder circuit. Of course, this increase in operating speed represents a trade off for the functional versatility of FIG. 30.

Figure 32:
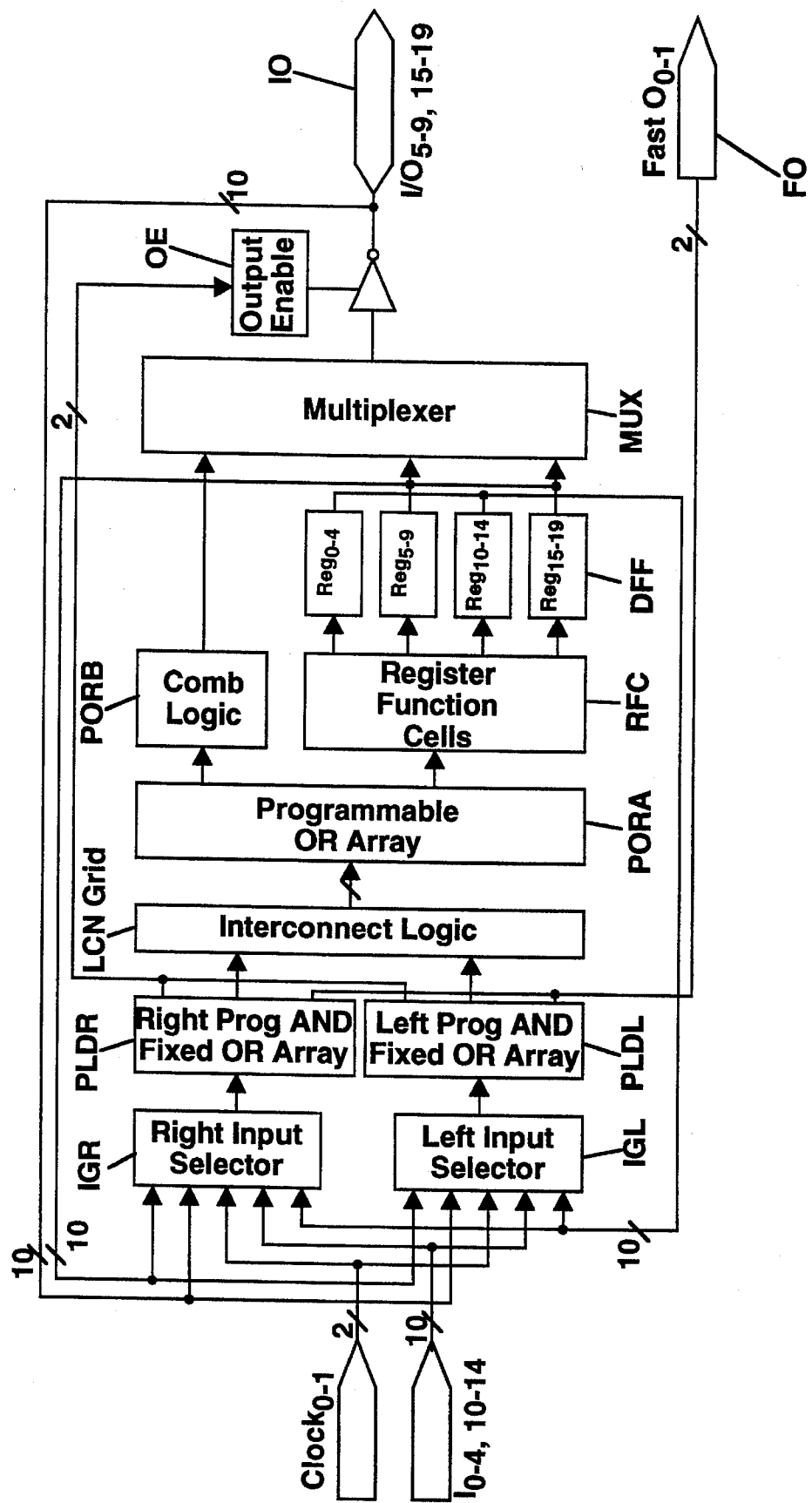
FIG. 32 is a block diagram of a configurable logic network suitable for implementing logic functions by use of interconnections as described with reference to FIGS. 18–29.

FIG. 32 shows in diagrammatic form, a configurable logic network CLN embodying circuit configurations based on those described herein. The network CLN includes two pairs of triangularly folded programmable logic devices PLDL and PLDR which may be based on the configurations described with reference to FIGS. 1–15, comprising a pair of PLDs arranged in a generally rectangular format as depicted by FIG. 16. The outputs from selected OR gates OG of each PLD of the pairs PLDL and PLDR are connected to programmable OR gates POR disposed in an array PORA.

The array PORA together with UBFGs and function cells KC located in the Register Function Cells array RFC, flip-flops DFF located in the Register blocks DFFs additional programmable OR gates located in the Combination Logic array, multiplexers MUX in the Multiplexer block, and output selection circuits located in the Output Function block are interconnected to provide logic functionality associated with circuits such as described with reference to FIGS. 18–29.

Thus, for example, circuits such as UCL2, UCL3A and UCL3B together with the associated UBFGs, logic signal generator cells KC, flip flops DFF and multiplexers MUX can be realized by appropriate interconnections between the blocks Programmable PORA, RFC, DFF and MUX. Circuits such as UCL1A, UCL1B and UCL1C can be realized by interconnections between the blocks PORB and MUX. Logic combination circuits such as LCN200 . . . LCN500 could be realized by connections between PLDL, PLDR and UBFGs in the block RFC.

Outputs from the multiplexer in the block MUX are transferred to the output pins I/O by outputs from PLDL and PLDR applied by output enable circuits in the output enable block OE. Output from flip flops in the blocks DFF also are connected as feedback logic inputs to the input selections IGL and IGR.

Logic inputs such as $A_xB_x$ and $C_xD_x$ are clocked from input/output pins I/O into input selectors IGL and IGR which perform the functionability of the circuit IG shown in FIG. 3, supplying the resultant minterms to AND gates of the programmable cells PC2 in the arrays PLDL and PLDR. Direct, or fast, outputs from the arrays PLDL and PLDR arrays are obtained by connections from the outputs of the OR gates OG of those arrays and output pins OF.

In a particular embodiment of the invention implemented according to the arrangement depicted in FIG. 32, each of the arrays PLDL and PLDR comprises two triangular folded PLD arrays each of which has eighteen PLFGs made up of eight pairs of FAND10, FAND12, FAND14 . . . FAND24 AND gate arrays the OR gates OG of which provide inputs to the programmable OR gate arrays PORA and PORB. An additional pair of PLFGs comprising FAND24 AND gate arrays have OR gates OG, the outputs from each is connected directly to the output pins OF. Outputs from the OR gate OG of the other FAND24 AND gate array in each of the arrays PLDL and PLDR provide output enable and UP/DOWN count control signals.

The overall circuit can be integrated on a semiconductor chip accommodated in a 28 pin DIP package, and has been designed under the type designation IT91AL101.

While particular embodiments of the invention have been described, these embodiments are examples illustrative of the invention and are not to be construed as limiting the invention.

We claim:

1. A configurable logic network having a plurality of programmable logic devices (PLD) coupled to a sub-network that is operable to perform logic operations using, logic instructions and logic values originating externally of the PLDs, under control of output logic control signals derived from said PLDs;

each programmable logic device comprising an AND logic array having inputs for receiving signals and generating product term output signals, OR logic array having inputs for receiving signals and generating sum term output signals, at least one of said logic arrays being programmable, said logic arrays interconnected to apply output signals from one of said AND and OR logic arrays as input signals to the other one of said AND and OR logic arrays, said other one of the AND and OR logic arrays providing PLD output signals;

a plurality of logic combination circuits coupled to at least one of said PLDs to receive selected ones of said PLD output signals and to produce at least one output logic control signal from each logic combination circuit as determined by the PLD output signals received by that logic combination circuit;

said sub-network comprising a controllable logic function sub-network operable to perform logic operations; inputs separate from said PLDs for supplying logic instructions and logic values to said sub-network for use in performing said logic operations; and control logic circuitry coupling at least some of said logic combination circuits to said sub-network to supply selected ones of said output logic control signals to said sub-network to control routing within said sub-network of said logic instructions and logic values, including logic instructions and logic values generated by said sub-network in performing said logic operations.

2. A configurable logic network according to claim 1, wherein said plurality of PLDs include PLDs each having a programmable AND logic array having inputs for receiving signals and generating product terms, and a fixed OR logic array having inputs coupled to said AND logic function array to receive product terms from said AND logic array, said OR logic function array generating sum terms comprising said PLD output signals.

3. A configurable logic network according to claim 2, wherein each said programmable AND logic array comprises a plurality of sets of logic function generators (PLFG), each said set having a common output AND logic gate;

each PLFG having a group of logic gates having to receive first and second sets of logic signals, said first set of logic signals comprising logic inputs for said programmable AND logic array, and said second set of logic signals being user programmable, said logic gates coupled to a PLFG output gate to apply inputs to said PLFG output gate determined according to said first and second sets of logic signals;

said PLFG output gates having outputs coupled to inputs of said common output AND logic gate for that set of PLFGs.

4. A configurable logic network according to claim 2, wherein each PLD includes a plurality of AND logic function gate groups, each AND logic function gate having outputs coupled to inputs of a logic OR function output gate individual to that AND logic function gate group;

each AND logic function gate group including individual output AND logic function gates having inputs coupled to outputs from respective programmable logic function generators (PLFG) of a set of PLFGs operatively associated with that AND logic function gate group;

each PLFG in a set of PLFGs having first and second sets of logic inputs, said first set of logic inputs to receive signals comprising a set of logic input signals for said programmable AND logic array and said second set of inputs receiving programmable signals, said PLFG generating an input to the output AND logic function gate of said set of PLFGs according to the signals received by said first and second sets of logic inputs;

in each set of PLFGs said first sets of logic inputs receiving the same set of in each set of PLFGs said first said logic input signals.

5. A configurable logic network according to claim 4, wherein said logic combination circuits are disposed in regions between neighboring ones of said plurality of PLDs.

6. A configurable logic network according to claim 4, wherein at least some of said AND logic numbers of said PLFGs.

7. A configurable logic network according to claim 1, wherein at least some of said logic combination circuits include a plurality of programmable logic function generators (PLFG);

each PLFG including a group of logic gates having first inputs and second inputs, said first inputs coupled to said PLDs to receive PLD output signals, and said second inputs to receive programmable signals, said group of logic gates coupled to an output gate of that PLFG to apply inputs to said PLFG output gate determined according to said signals received by said first and second inputs; and said control logic circuitry couples outputs of said PLFG output gates to said sub-network to provide said output logic control signals for said sub-network.

8. A configurable logic network according to claim 7, wherein said control logic circuitry comprises OR logic function generators having inputs coupled to a plurality of said logic combination circuits to receive said output logic control signals, said OR logic function generators having outputs coupled to said sub-network, each OR logic function generator having programmable inputs for selecting the output logic control signals supplied to said sub-network.

9. A configurable logic network according to claim 1, wherein at least some of said logic combination circuits include at least one programmable logic function generator including a group of logic gates having inputs coupled to said PLDs to receive PLD output signals from different ones of said PLDs, and second inputs to receive programmable signals, said group of logic gates coupled to apply inputs to an output gate of said logic function generator as determined by said signals received by said first and second inputs; and said control logic circuitry couples outputs of said logic function generator output gates to said sub-network to provide said output logic control signals for said sub-network.

10. A configurable logic network according to claim 1, comprising:

a plurality of programmable logic devices (PLD), each programmable logic device comprising an AND logic function array having inputs for receiving signals and generating product term output signals; an OR logic function array having inputs for receiving signals and generating sum term output signals;

said PLDs each having a programmable AND logic function array comprising a plurality of sets of first programmable logic function generators (PLFG), each said set having a common output gate;

each first PLFG including a group of logic gates having inputs to receive first and second sets of logic signals, said first set of logic signals comprising logic inputs for said programmable AND logic function array, and said second set of logic signals being programmable, said logic gates connected to apply inputs to an output gate of said first PLFG determined according to said first and second sets of logic signals;

said output gates of said first PLFGs coupled to provide inputs to said common output gate for that said set of first PLFGs;

in each PLD, said common output of said sets of first PLFGs coupled to inputs of said OR logic function array to apply output signals from said AND logic function array as input signals to said OR logic function array said OR logic array providing PLD output signals;

wherein at least some of said logic combination circuits each include a plurality of second programmable logic function generators (PLFG), said second PLFGs comprising respective groups of logic gates including first logic inputs coupled to said PLDs to receive a plurality of PLD output signals and second inputs to receive programmable signals; in each said second PLFG, said group of logic gates coupled to inputs of an output gate of that second PLFG as determined by the logic signals received by said first and second inputs of the group of logic gates of that second PLFG;

wherein said control logic circuitry selectively couples outputs of said second PLFG output gates to said sub-network to provide said output logic control signals for said sub-network.

11. A configurable logic network according to claim 1, wherein said sub-network includes programmable logic function generator means (PLFG) for receiving a plurality of said output logic control signals from selected ones of said logic combination circuits to control generation of an output logic signal from said PLFG by selection of programmable second logic signals received by said PLFG; a store having an input coupled to said PLFG to receive said output logic signal; means for transferring a signal from said store as an input to a logic signal selector means for coupling said programmable second logic signals to said PLFG according to predetermined selection signals applied to said logic signal selector, said second logic signals each selectable from a group corresponding at least to said output logic signal, and Boolean logic value signals originating externally of said PLDs.

12. A configurable logic network according to claim 11, including programmable memory cells to store said predetermined selection signals.

13. A configurable logic network according to claim 11, including a terminal coupled to said logic signal selector to supply one of said logic value signals originating externally of said PLDs.

14. A configurable logic network according to claim 1, wherein said control logic circuitry comprises signal selectors, each said signal selector having individually controllable programmable inputs to determine the output logic control signals supplied to said sub-network from said logic combination circuits; said sub-network including a plurality of logic stages, each said logic stage comprising:

logic function generator circuitry (UBFG) coupled to a plurality of said signal selectors to receive selected ones of said output logic control signals to control generation of an output logic signal from said UBFG a store coupled to said UBFG to receive said output logic signal; logic cells having outputs coupled to said second inputs of said logic function generator circuitry to supply said second logic function signals, said logic cells each including an input coupled to said store to receive a stored output logic signal, and inputs to receive predetermined selection signals to select said second logic signals from a group corresponding at least to said stored output logic signal and Boolean logic value signals originating externally of said PLDs.

15. A configurable logic network according to claim 14, wherein at least a plurality of said successive logic stages each includes logic gating circuitry having an output coupled to one of the inputs of at least one logic cell of that stage, said logic gating circuitry including inputs coupled to stores of a plurality of said stages to receive stored output logic signals.

16. A configurable logic network according to claim 15, wherein said logic gating circuitry inputs are coupled to stores of different ones of said stages.

17. A configurable logic network according to claim 14, wherein at least a plurality of neighboring logic stages each includes means for supplying said output signal from said store of that logic stage to a logic signal selector of a neighboring logic stage for selection as one of said second logic function signals from that logic selector.

18. A configurable logic network according to claim 1, wherein a plurality of said logic combination circuits include at least one programmable logic function generator (PLFG) including a group of logic gates having first and second inputs, said first inputs coupled to one of said PLDs to receive a plurality of first logic signals comprising PLD output signals from said one PLD, and said second inputs to receive programmable logic signals; said group of logic gates having outputs coupled to inputs of an output gate of said PLFG as determined by the logic signals received by said first and second inputs; and said control logic circuitry selectively couples outputs of said PLFG output gates to said sub-network to provide said output logic control signals to control said logic operations performed by said sub-network.

19. A configurable logic network comprising:

a plurality of programmable logic devices (PLD), each PLD comprising a programmable AND logic array having inputs for receiving logic signals and generating product term output signals, and an OR logic array having inputs coupled to said AND logic array to receive said product term output signals; said OR logic array generating sum term PLD output signals;

said programmable AND logic array comprising a plurality of sets of first logic function generators (PLFG), each said sets of first PLFGs having a common output gate;

each first PLFG having first set of inputs, a second set of inputs, and an output, said first set of inputs defining said programmable AND logic array inputs, and said second set of inputs to receive programmable logic signals, in each said set of first PLFGs, said PLFG outputs coupled to inputs of said common output gate for said set of first PLFGs;

a plurality logic combination circuits each including at least one second programmable logic function generator (PLFG), each second PLFG having a first set of inputs, a second set of inputs, and an output, said first set of inputs coupled to the OR logic array of at least one of said PLDs to receive PLD output signals and said second set of inputs to receive programmable logic signals;

a controllable logic function sub-network operable to perform logic operations, said sub-network comprising a plurality of third programmable logic function generators (PLFG), each third PLFG having a first set of inputs, a second set of inputs, and an output, signal selector logic coupled to said second set of inputs to couple individually programmable logic signals to said set of second inputs, said programmable logic signals selectable from a group of logic signals including logic values and logic instructions; and control logic circuitry coupling outputs of a plurality of said logic combination networks to said set of first inputs of said third PLFGs;

wherein each of said first, second and third PLFGs comprises a group of logic gates providing said a first set of inputs and said second set of inputs of that PLFG, said group of logic gates having outputs coupled to inputs of an output gate of that PLFG determined according to the logic signals received by said first set of inputs and said second set of inputs of that PLFG;

and wherein routing of said programmable logic signals received by the second sets of inputs of said third PLFGs to the said outputs of said third PLFGs is controlled by logic signal outputs from said logic combination circuits.

20. A configurable logic network according to claim 19, further including stores coupled to a plurality of said third PLFGs to store logic signals output from said plurality of third PLFGs, at least some of said stores also coupled to output stored logic signals to said signal selector logic of at least one of said third PLFGs, said output stored logic signals providing some of said logic programmable signals.

21. A configurable logic network device according to claim 19, wherein each of said first, second and third PLFGs includes $2^n$ second inputs, where n represents the number of inputs in said set of first inputs.

22. A configurable logic network according to claim 19, wherein each of said first, second and third PLFGs comprises a logic converter including said first set of inputs, said logic converter outputting minterms of logic signals received by said first set of inputs; and wherein said group of logic gates comprises a group of AND logic function gates, the first set of inputs to said AND logic function gates coupled to said logic converter to receive said minterms output from said logic converter.

23. A configurable logic network having a plurality of programmable logic devices (PLD), wherein each PLD includes a plurality of AND logic function gate groups, each AND logic function gate group having outputs coupled to inputs of a logic OR function output gate individual to that AND logic function gate group; said OR gates providing an OR gate array of that PLD and outputs from said OR gates providing PLD output signal;

each AND logic function gate group including individual output AND logic function gates having inputs coupled to outputs from respective programmable logic function generators (PLFG) of a set of PLFGs operatively associated with that AND logic function gate group;

each PLFG in a set of PLFGs having first and second sets of logic inputs, said first set of logic inputs to receive signals comprising a set of logic input signals for said programmable AND logic array and said second set of inputs to receive programmable logic signals, each said PLFG generating a logic input to the output AND logic function gate of said set of PLFGs according to the signals received by said first and second sets of logic inputs;

in each set of PLFGs said first sets of logic inputs receiving the same set of said logic input signals;

in different ones of at least some of said AND logic function gate groups, the number of said PLFGs in a set of PLFGs being different from each other; and a plurality of logic combination circuits each comprising a plurality of AND logic function gates having first inputs coupled to outputs of a first AND logic function gate group of one of said plurality of PLDs, and second outputs coupled to outputs of a first AND logic function gate group of another of said plurality of PLDs, whereby the effective number of logic signal inputs to said AND logic gates of a said logic combination circuit is determined by the number of PLFGs in said first AND logic function gate groups.

24. A configurable logic network according to claim 23, wherein for at least one of said logic combination circuits, said first AND logic function gate group of said one of said plurality of PLDs and said first AND logic function gate group of said another PLD, respectively comprise sets of said PLFGs having different numbers of PLFGs.

25. A configurable logic network comprising a programmable logic device (PLD) coupled to a subnetwork operable under control of output signals from said PLD:

said PLD including an AND logic array having inputs to receive signals and generating product term output signals; an OR logic array having inputs to receive signals and generating sum term output signals; at least one of said logic arrays being programmable; said logic arrays interconnected to apply output signals from one of said AND and OR logic arrays as input signals to the other one of said AND and OR logic arrays; said other one of the AND and OR logic arrays providing said PLD output signals; and said sub-network including a programmable logic function generator (PLFG) having first and second inputs coupled by logic gates to a common output gate; programmable logic circuitry coupling said first inputs of said PLFG and said PLD to couple a selected plurality of said PLD output signals to said first inputs of said PLFG; said second inputs of said PLFG supplying a set of user programmable second input signals comprising logic values selectively representing data and logic instructions, no second input signal being a PLD output signal; said PLD output signals controlling operation of said PLFG to couple said second input signals individually to said common output gate to produce a PLFG output signal as determined by logic functions of said selectable plurality of PLD output signals received by said first inputs of said PLFG;

said subnetwork also including a store having an input coupled to the common output gate of said PLFG to receive and store said PLFG output logic signal; and logic signal selectors having outputs coupled to said second inputs of said PLFG, said logic signal selectors each having an input coupled to said store to receive said stored output logic signal, and further inputs to receive programmable selection signals to operate said logic signal selectors to provide said second input signals to said PLFG, each said second signal individually selectable to correspond to any of said stored output logic signal and Boolean logic value signals, as determined by said programmable selection signals received by said signal logic signal selectors.

26. A controllable logic network according to claim 25, wherein said PLFG includes m(m>1) first inputs and $2^m$ second inputs, and said logic functions of said selectable plurality of PLD output signals are defined by minterms of said PLD output signals received by said m first inputs of said PLFG.

27. A method of performing logic operations, including the steps of: operating a programmable logic device (PLD) to generate PLD output signals comprising desired logic functions of input signals to said PLD; applying selected ones of said PLD output signals as first input signals to a programmable logic function generator (PLFG); applying a set of programmable second input signals to said PLFG, no second input signal being a PLD output signal, said second input signals comprising logic values selectively representing data and logic instructions; said PLD output signals controlling operation of said PLFG by selectively coupling individual ones of said second input signals to an output of said PLFG according to a selected logic function of said first input signals.

28. A method of performing logic operations according to claim 27, using m(m>1) first input signals and $2^m$ second input signals, and wherein said selected logic function is defined by any minterm of said m first input signals.

29. A method according to claim 27, wherein said first input signals are programmably selectable PLD output signals.

30. A configurable logic network comprising a programmable logic device (PLD) coupled to a subnetwork comprising a plurality of logic stages:

said PLD including an AND logic array having inputs to receive signals and generating product term output signals; an OR logic array having inputs to receive signals and generating sum term output signals; at least one of said logic arrays being programmable; said logic arrays interconnected to apply output signals from one of said AND and OR logic arrays as input signals to the other one of said AND and OR logic arrays; said other one of the AND and OR logic arrays providing said PLD output signals; and in said sub-network, each of said plurality of logic stages including a programmable logic function generator (PLFG) having first and second inputs coupled by logic gates to a common output of that PLFG, a store coupled to said common output gate, and a plurality of logic cells having outputs respectively coupled to said second inputs of that PLFG; logic selectors coupling said first inputs of said PLFGs to said PLD to receive selected PLD output signals; said second inputs of each PLFG supplying a set of second input signals to that PLFG no said second input signal being a PLD output signal; each said PLFG producing an output logic signal at said common output by operation of said logic gates of that PLFG to selectively couple to said common output an individual one of said second input signals to that PLFG under control by respective logic functions of said selected PLD output signals received by said first inputs of that PLFG; said store receiving said output logic signal from that PLFG; and said logic cells of a PLFG each including an input coupled to said store of that PLFG to receive a stored output logic signal, and further inputs to receive predetermined selection signals to select said second input signals for that PLFG from a group of signals corresponding at least to said stored output logic signal from that PLFG and Boolean logic signals;

and wherein each logic staff of a plurality of said logic stages includes means for supplying said output logic signal from said store of that logic stage as one of said group of signals for selection as a second input signal to the logic cells of the PLFG of a neighboring logic stage.

31. A configurable logic network according to claim 30, wherein said logic gating circuitry inputs are coupled to stores of different ones of said logic stages.

32. A configurable logic network according to claim 30, wherein each logic stage of at least a plurality of said logic stages includes means for supplying said output signal from said store of that logic stage to a logic signal selector of a neighboring logic stage for selection as one of said second input signals from that logic selector.

33. A configurable logic network according to claim 30, wherein said store comprises a clocked register.

* * * * *